(12) United States Patent
Lee et al.

(10) Patent No.: US 9,165,612 B2
(45) Date of Patent: Oct. 20, 2015

(54) MEMORY AND MEMORY SYSTEM INCLUDING THE SAME

(71) Applicant: SK hynix Inc., Gyeonggi-do (KR)

(72) Inventors: Doo-Chan Lee, Gyeonggi-do (KR); Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 38 days.

(21) Appl. No.: 14/109,237

(22) Filed: Dec. 17, 2013

(65) Prior Publication Data

US 2015/0049566 A1 Feb. 19, 2015

(30) Foreign Application Priority Data

Aug. 13, 2013 (KR) .................... 10-2013-0096031

(51) Int. Cl.
*G11C 7/00* (2006.01)
*G11C 7/02* (2006.01)
*G11C 11/406* (2006.01)
*G11C 11/408* (2006.01)

(52) U.S. Cl.
CPC ............... *G11C 7/02* (2013.01); *G11C 11/408* (2013.01); *G11C 11/40611* (2013.01); *G11C 11/40618* (2013.01); *G11C 11/40622* (2013.01)

(58) Field of Classification Search
USPC ........................................................ 365/222
See application file for complete search history.

(56) References Cited

U.S. PATENT DOCUMENTS

| 6,005,810 A | 12/1999 | Wu |
| 6,894,917 B2 | 5/2005 | Ting et al. |
| 2009/0201753 A1* | 8/2009 | Riho et al. ............... 365/200 |

FOREIGN PATENT DOCUMENTS

| KR | 95-28551 | 10/1995 |
| KR | 1020050095980 | 10/2005 |
| KR | 1020140029023 | 3/2014 |
| KR | 1020150019479 | 2/2015 |

* cited by examiner

*Primary Examiner* — Hoai V Ho
*Assistant Examiner* — Pablo Huerta
(74) *Attorney, Agent, or Firm* — IP & T Group LLP

(57) ABSTRACT

A memory including a first cell block comprising a plurality of first word line groups, and one or more first redundancy word line groups each corresponding to one hit signal of a plurality of hit signals; a second cell block comprising a plurality of second word line groups, and one or more second redundancy word line groups each corresponding to one hit signal of the plurality of hit signals; and a control unit suitable for selecting a cell block and a word line in response to a first input address and refreshing a selected word line based on an input address inputted after the first input address, while refreshing one or more adjacent word lines adjacent to a first selected word line, which is selected by the first input address, in response to the first input address and the hit signals when the first selected word line is adjacent to a redundancy word line, wherein the first input address is first inputted in a target refresh section.

23 Claims, 9 Drawing Sheets

MEMORY AND MEMORY SYSTEM INCLUDING THE SAME

CROSS-REFERENCE TO RELATED APPLICATIONS

The present application claims priority of Korean Patent Application No. 10-2013-0096031, filed on Aug. 13, 2013, which is incorporated herein by reference in its entirety.

BACKGROUND

1. Field

Exemplary embodiments of the present invention relate to a memory and a memory system including the same.

2. Description of the Related Art

A memory cell of a memory includes a transistor serving as a switch and a capacitor for storing electrical charge, i.e. data. According to whether or not the capacitor in the memory cell stores electrical charge, i.e. according to whether a potential between both terminals of the capacitor is high or low, a logic level of data is determined as a high level (logic "1") or a low level (logic "0").

Since the data is stored in the capacitor in the form of an accumulated electrical charge, it would be ideal that there is no power consumption of the stored electrical charge. However, since current leakage occurs due to a PN junction of a metal oxide semiconductor (MOS) transistor, the stored initial electrical charge may be discharged, and thus the stored data may be lost. To prevent such data loss, it is necessary to read data stored in a memory cell and to recharge the memory cell based on the read data before the data is lost. Such an operation of recharging the memory cell is called a refresh operation. The refresh operation should be periodically performed to maintain stored data.

FIG. 1 is a diagram illustrating a part of a cell array included in a memory for describing a word line disturbance.

In FIG. 1, "WLK−1" "WLK", and "WLK+1" indicate three word lines which are disposed one by one in a cell array. The word line WLK indicated by "HIGH_ACT" represents a frequently activated word line, which has a large number of activation times or a high activation frequency, and the word lines WLK−1 and WLK+1 represent adjacent word lines, which are disposed adjacent to the frequently activated WLK. "CELL_K−1", "CELL_K", and "CELL_K+1" indicate memory cells coupled to the word lines WLK−1, WLK, and WLK+1, respectively. The memory cells CELL_K−1, CELL_K, and CELL_K+1 include cell transistors TR_K−1, TR_K, and TR_K+1, and cell capacitors CAP_K−1, CAP_K, and CAP_K+1, respectively. For reference, "BL" and "BL+1" indicate a bit line.

When the frequently activated word line WLK is activated or precharged, voltages of the adjacent word lines WLK−1 and WLK+1 increase or decrease due to a coupling phenomenon occurring between the word lines WLK, WLK−1 and WLK+1. Accordingly, the amount of charges stored in the cell capacitors CAP_K−1, CAP_K, and CAP_K+1 is affected. Therefore, when the frequently activated word line WLK is toggled between an active state and a precharge state, data stored in the cell capacitors CAP_K−1 and CAP_K+1 may be lost due to a change in the amount of charge stored in the cell capacitors CAP_K−1 and CAP_K+1.

In addition, an electromagnetic wave is generated while a word line is toggled between an active state and a precharge state, and the electromagnetic wave allows electrons to flow into or flow out of a cell capacitor included in a memory cell which is coupled to adjacent word lines. As a result, data stored in the memory cell may be lost.

SUMMARY

Various exemplary embodiments are directed to provide a memory and a memory system for preventing data of a memory cell coupled to an adjacent word line adjacent to a frequently activated word line from being lost by refreshing the adjacent word line.

Also, various exemplary embodiments are directed to provide a memory and a memory system for preventing data of a memory cell coupled to an adjacent word line adjacent to a frequently activated word line from being lost even when the frequently activated word line is a redundancy word line to be replaced for a normal word line.

In an exemplary embodiment, a memory may include a first cell block comprising a plurality of first word line groups each having two or more first word lines, and one or more first redundancy word line groups each having two or more first redundancy word lines and corresponding to one hit signal of a plurality of hit signals; a second cell block comprising a plurality of second word line groups each having two or more second word lines, and one or more second redundancy word line groups each having two or more second redundancy word lines and corresponding to one hit signal of the plurality of hit signals; and a control unit suitable for selecting a cell block and a word line in response to a first input address and refreshing a selected word line based on an input address inputted after the first input address, while refreshing one or more adjacent word lines adjacent to a first selected word line, which is selected by the first input address, in response to the first input address and the hit signals when the first selected word line is adjacent to a redundancy word line, wherein the first input address is first inputted in a target refresh section.

In an exemplary embodiment, a memory system may include a memory comprising a first cell block suitable for including a plurality of first word line groups each having two or more first word lines, and one or more first redundancy word line groups each having two or more first redundancy word lines and corresponding to one hit signal of a plurality of hit signals, and a second cell block suitable for including a plurality of second word line groups each having two or more second word lines, and one or more second redundancy word line groups each having two or more second redundancy word lines and corresponding to one hit signal of the plurality of hit signals, wherein the memory selects a cell block and a word line in response to a first input address and refreshes a selected word line based on an input address inputted after the first input address, while refreshing one or more adjacent word lines adjacent to the first selected word line, which is selected by the first input word line, in response to the first input address and the hit signals when the first selected word line is adjacent to a redundancy word line, wherein the first is first inputted in a target refresh section; and a memory controller suitable for controlling the memory to enter the target refresh section when a word line on which the target refresh operation is to be performed is detected, and applying one or more addresses for selecting the detected word line of the memory during the target refresh operation.

DETAILED DESCRIPTION

Figure 1:
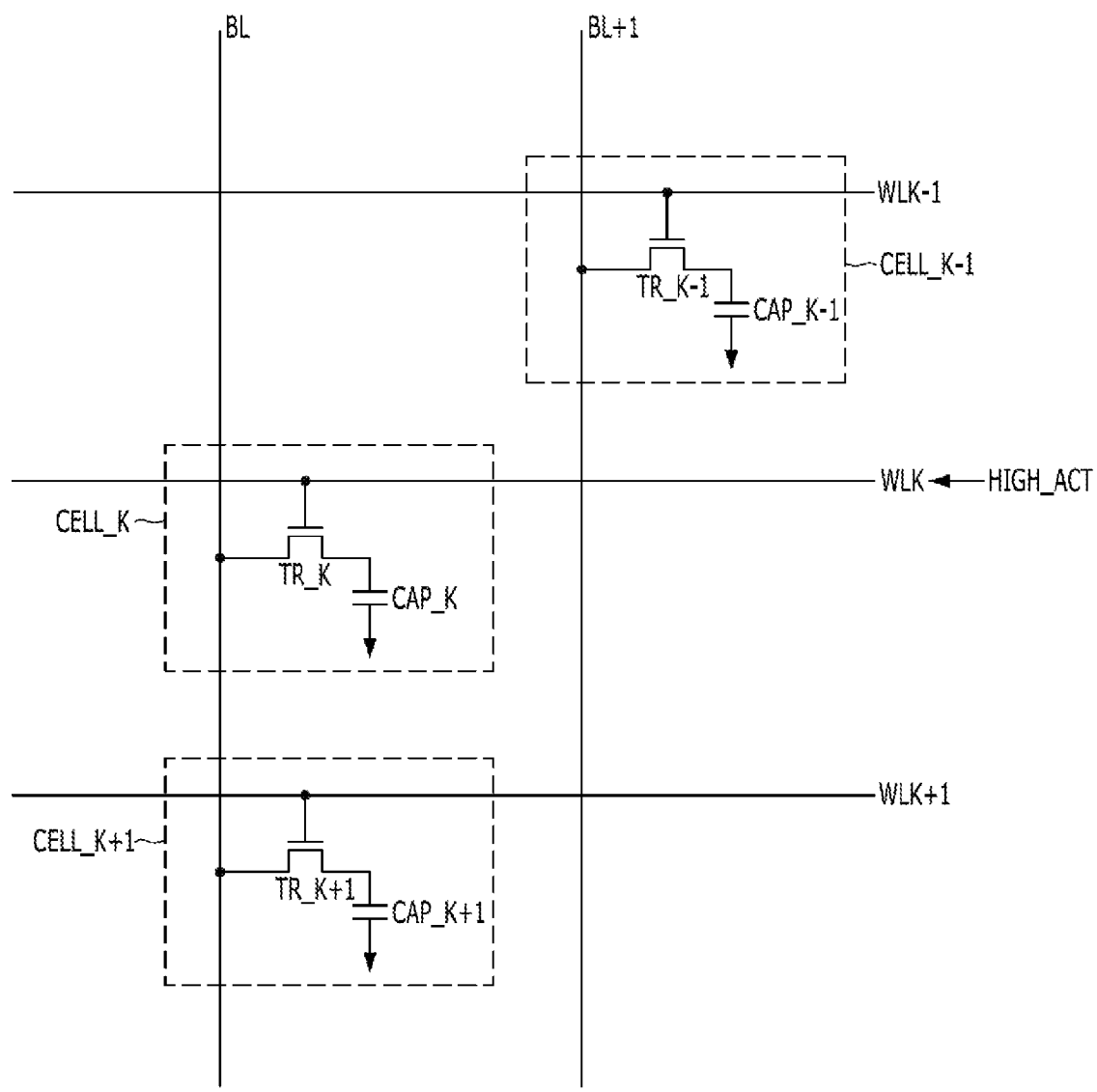
FIG. 1 is a diagram illustrating a part of a cell array included in a memory for describing a word line disturbance.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

The drawings are not necessarily to scale and in some instances, proportions may have been exaggerated in order to clearly illustrate features of the embodiments.

Hereinafter, when a word line is activated in response to an active command on a refresh operation, a memory cell coupled to the activated word line is refreshed. In addition, refreshing a word line may represent refreshing memory cells coupled to the corresponding word line.

Hereinafter, a frequently activated word line may represent a word line which has the activation number equal to or greater than a reference number, or an activation frequency that satisfies a predetermined condition, e.g. higher than a reference frequency. An adjacent word line may represent a word line which is disposed adjacent to the frequently activated word line and which allows data of memory cells coupled thereto to be influenced by an active or precharge operation of the frequently activated word line.

Figure 2:
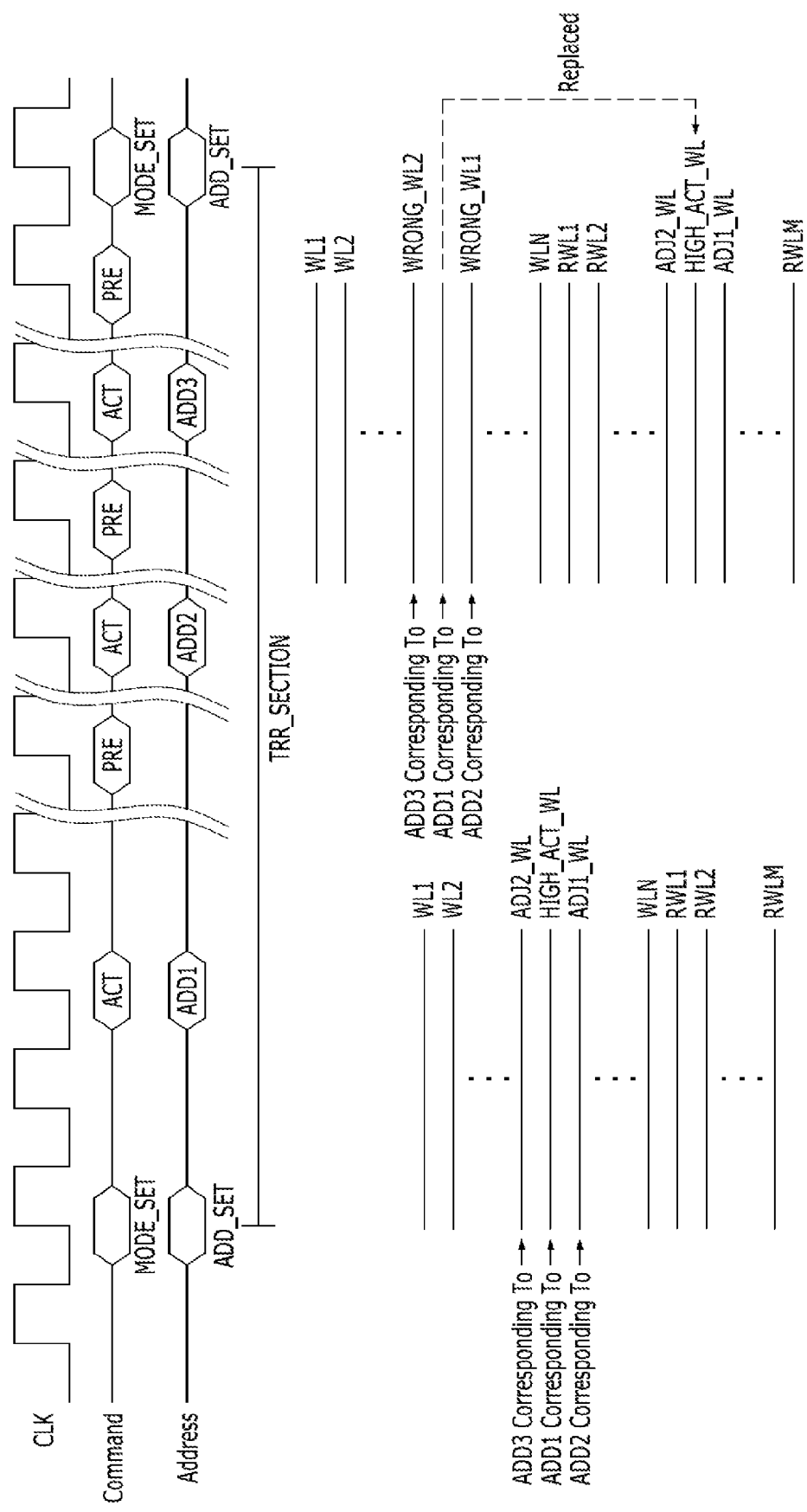
FIG. 2 is a timing diagram for describing a target refresh operation for refreshing an adjacent word line which is adjacent to a frequently activated word line.

FIG. 2 is a timing diagram describing a target refresh operation for refreshing an adjacent word line which is adjacent to a frequently activated word line.

Referring to FIG. 2, commands MODE_SET, ACT, and PRE, and addresses ADD1 to ADD3 and ADD_SET may be inputted in synchronization with a dock signal CLK.

A memory may include a plurality of word lines WL1 to WLN each of which is coupled to a plurality of memory cells (not shown), and one or more redundancy word lines RWL1 to RWLM.

When a frequently activated word line HIGH_ACT_WL is detected, a memory controller (not shown) may apply a command MODE_SET for setting an operating mode of the memory. The command MODE_SET may include a Mode Register Set (MRS) command for the memory. The memory controller may apply an address ADD_SET to the memory together with the command MODE_SET. The memory may enter a target refresh section TRR_SECTION in response to the command MODE_SET and the address ADD_SET.

After the memory enters the target refresh section TRR_SECTION, the memory controller may sequentially apply an active command ACT and a precharge command PRE to the memory, and together therewith, may apply an address ADD1 corresponding to the frequently activated word line HIGH_ACT_WL and addresses ADD2 and ADD3 for selecting adjacent word lines ADJ1_WL and ADJ2_WL adjacent to the frequently activated word line HIGH_ACT_WL, respectively.

When the target refresh operation has been completed, the memory controller may apply an address ADD_SET for the memory to terminate the target refresh section, together with the command MODE_SET to the memory. The memory may terminate the target refresh section TRR_SECTION in response to the command MODE_SET and the address ADD_SET.

As shown in a left-side view, when the frequently activated word line HIGH_ACT_WL is one of the word lines WL1 to WLN, when the addresses ADD2 and ADD3 are applied to the memory, the adjacent word lines ADJ1_WL and ADJ2_WL are selected and activated or precharged, and thus the target refresh operation is normally performed.

As shown in a right-side view, when the frequently activated word line HIGH_ACT_WL is one of the redundancy word lines RWL1 to RWLM due to a replacement of a normal word line, when the addresses ADD2 and ADD3 are applied to the memory, wrong word lines WRONG_WL1 and WRONG_WL2, not the adjacent word lines ADJ1_WL and ADJ2_WL adjacent to the frequently activated word line HIGH_ACT_WL, are selected and activated or precharged, and thus the target refresh operation is abnormally performed.

Since a redundancy word line may be selected by an address inputted from the outside of a memory, a method for normally performing a target refresh operation on the redundancy word line is required.

Figure 3:
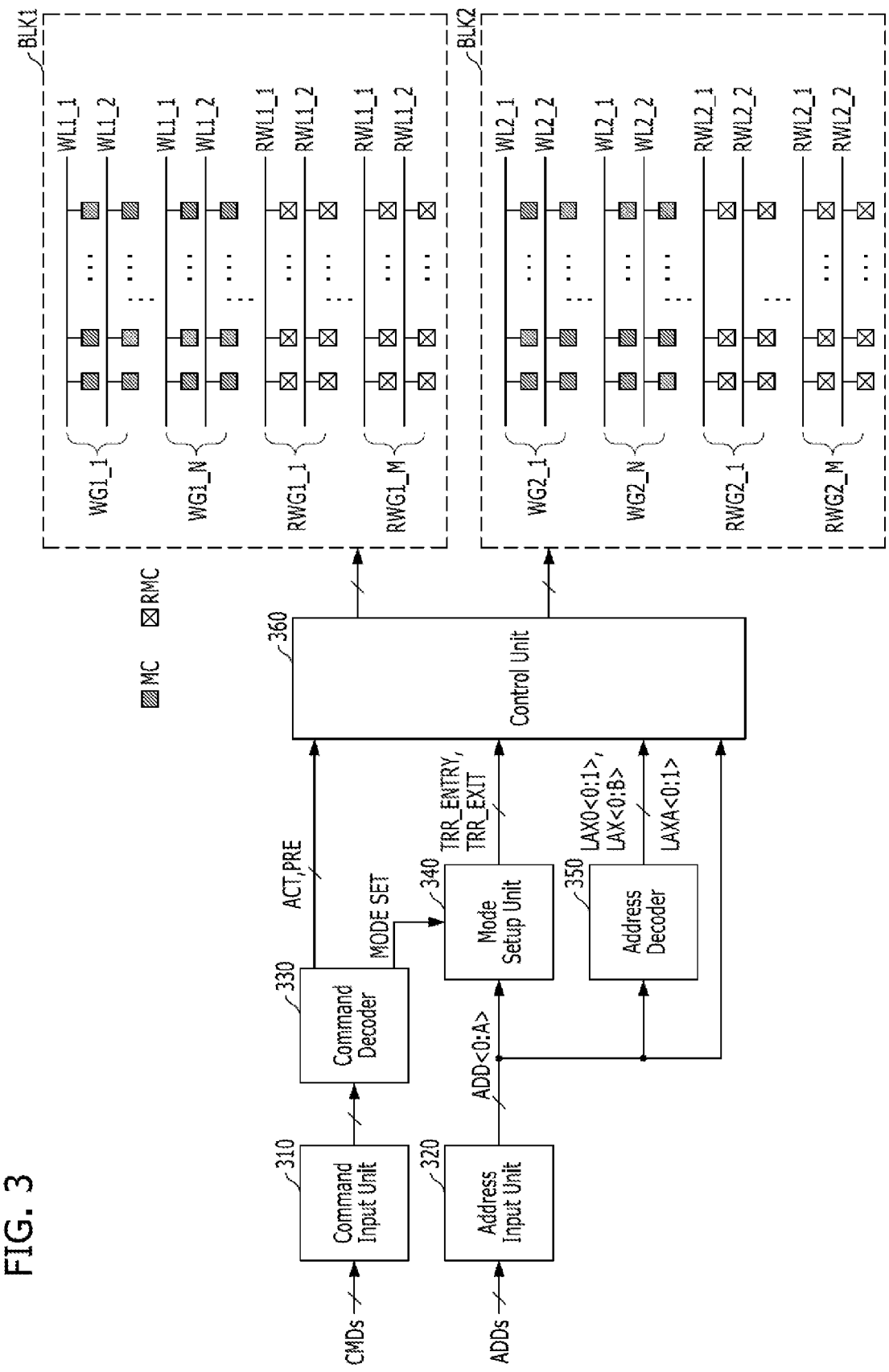
FIG. 3 is a block diagram illustrating a memory according to an exemplary embodiment of the present invention.

FIG. 3 is a block diagram illustrating a memory according to an exemplary embodiment of the present invention.

As illustrated in FIG. 3, a memory may include a command input unit 310, an address input unit 320, a command decoder 330, a mode setup unit 340, an address decoder 350, a control unit 360, a first cell block BLK1, and a second cell block BLK2. FIG. 3 illustrates the configuration related with an active operation and a target refresh operation in a memory except for configurations related with the other operations such as a read operation, a write operation, and the like, which have no direct relation to the present invention.

A memory will be described with reference to FIG. 3.

The command input unit 310 may receive commands CMDs applied from a memory controller (not shown), and the address input unit 320 may receive addresses ADDs applied from the memory controller. Each of the commands CMDs and the addresses ADDs may include multi-bit signals.

The command decoder 330 may decode the commands CMDs inputted through the command input unit 310 and generate an active command ACT, a precharge command PRE, and a mode setup command MODE_SET. The active command ACT may be activated when a combination of the command signals CMDs represents the active command ACT, the precharge command PRE may be activated when a combination of the command signals CMDs represents the precharge command PRE, and the mode setup command MODE_SET may be activated when a combination of the command signals CMDs represents the mode setup command MODE_SET. In addition, the command decoder 330 may decode the commands signals CMDs and generate other commands for a refresh operation, a read operation, a write operation, and the like, but the description and illustration thereof are omitted as they have no direct relation to the present invention.

The address decoder 350 may decode an address ADD<0: A> inputted through the address input unit 320 and may generate a plurality of decoded signals LAX0<0:1>, LAX<0: B>, and LAXA<0:1>. The decoded signal LAX0<0:1> may be obtained by decoding the lowest bit ADD<0> of the address ADD<0:A>, and the decoded signal LAXA<0:1> may be obtained by decoding a bit ADD<A> of the address ADD<0:A>, for selecting a block (hereinafter, referred to as a "block selection bit"). The decoded signal LAX<0:B> may be obtained by decoding the other bits ADD<1:A−1> of the address ADD<0:A> (hereinafter, referred to as "group selection bits").

The lowest bit ADD<0> may be a bit for selecting one of two or more word lines which are included in a word line group or a redundancy word line group. For example, when the lowest bit ADD<0> has a value of "0", the first-disposed word line in a word line group may be selected; and when the lowest bit ADD<0> has a value of "1", the last-disposed word line in the word line group may be selected. When the lowest bit ADD<0> has a value of "0", a first bit LAX0<0> of the decoded signal LAX0<0:1> may be activated; and when the lowest bit ADD<0> has a value of "1", a second bit LAX0<1> of the decoded signal LAX0<0:1> may be activated.

When the block selection bit ADD<A> has a value of "0", the first cell block BLK1 may be selected, and when the block selection bit ADD<A> has a value of "1", the second cell block BLK2 may be selected. When the block selection bit ADD<A> has a value of "0", a first bit LAXA<0> of the decoded signal LAXA<0:1> may be activated, and when the block selection bit ADD<A> has a value of "1", a second bit LAXA<1> of the decoded signal LAXA<0:1> may be activated.

The first cell block BLK1 may include a plurality of first word line groups WG1_1 to WG1_N, each including two or more first word lines WL1_1 and WL1_2, and one or more first redundancy word line groups RWG1_1 to RWG1_M, each including two or more first redundancy word lines RWL1_1 and RWL1_2 to be replaced for at least one of the plurality of first word line groups WG1_1 to WG1_N. As illustrated in FIG. 3, in the first cell block BLK1, the plurality of first word line groups WG1_1 to WG1_N may be sequentially disposed, and one or more first redundancy word line groups RWG1_1 to RWG1_M may be sequentially disposed after the last-disposed one of the plurality of first word line groups WG1_1 to WG1_N.

The second cell block BLK2 may include a plurality of second word line groups WG2_1 to WG2_N, each including two or more second word lines WL2_1 and WL2_2, and one or more second redundancy word line groups RWG2_1 to RWG2_M, each including two or more second redundancy word lines RWL2_1 and RWL2_2 to be replaced for at least one of the plurality of second word line groups WG2_1 to WG2_N. As illustrated in FIG. 3, in the second cell block BLK2, the plurality of second word line groups WG2_1 to WG2_N may be sequentially disposed, and one or more second redundancy word line groups RWG2_1 to RWG2_M may be sequentially disposed after the last-disposed one of the plurality of second word line groups WG2_1 to WG2_N.

The word lines WL1_1, WL1_2, WL2_1, and WL2_2 replaced by the redundancy word lines RWL1_1, RWL1_2, RWL2_1, and RWL2_2, may be "normal word lines".

Figure 4:
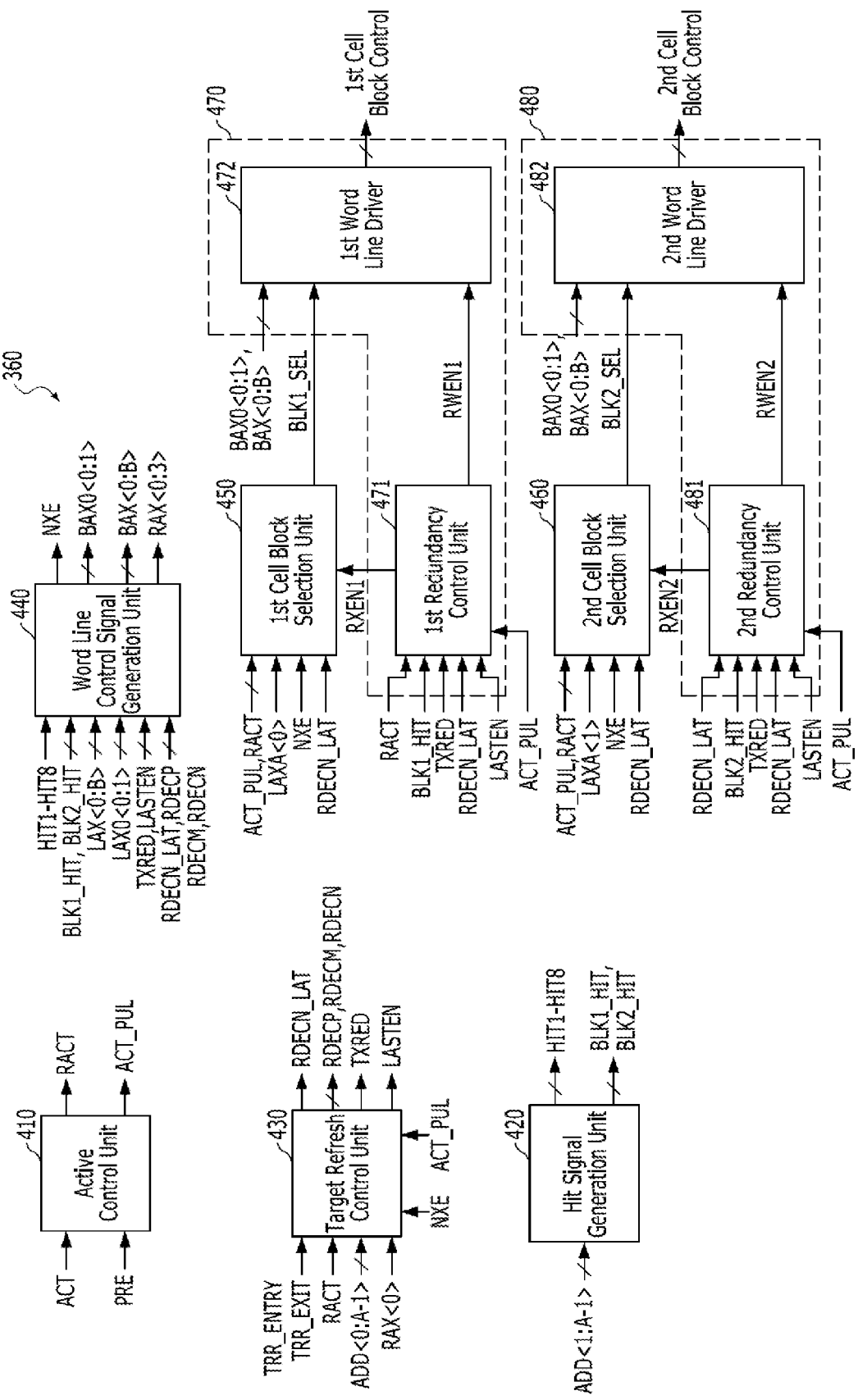
FIG. 4 is a detailed block diagram illustrating a control unit show in FIG. 3.

Each of the redundancy word line groups RWG1_1 to RWG1_M and RWG2_1 to RWG2_M may correspond to one hit signal among a plurality of hit signals HIT1 to HIT8 (shown in FIG. 4). The respective word lines may be disposed in order from "WLx_1" to "WLx_2" in a word line group, and the respective redundancy word lines may be disposed in order from "RWLx_1" to "RWLx_2" in a redundancy word line group. The following description will be given as an example where each cell block includes four redundancy word line groups (i.e. a case wherein M=4). The cell blocks BLK1 and BLK2 include a plurality of bit lines, and memory cells MCs are coupled to the bit lines and the word lines. Since the memory according to the exemplary embodiment of the present invention is related to an access to the word lines, an illustration of the bit lines is omitted.

The mode setup unit 340 may set an operating mode of a memory based on the address ADD<0:A> when the mode setup command MODE_SET is activated. When the mode setup command MODE_SET is activated and the input address ADD<0:A> corresponds to entry into a target refresh section, the mode setup unit 340 may activate an entry signal TRR_ENTRY. When the mode setup command MODE_SET is activated and the input address ADD<0:A> corresponds to a termination of the target refresh section, the mode setup unit 340 may activate a termination signal TRR_EXIT. The memory may enter the target refresh section when the entry signal TRR_ENTRY is activated, and may terminate the target refresh section when the termination signal TRR_EXIT is activated.

The control unit 360 may select a cell block and a word line, and may activate and precharge the selected word line in the selected cell block. In this case, a refresh operation is performed on the selected word line by activating and precharging the selected word line in the target refresh section.

When a word line selected based on the input address ADD<0:A> is not replaced by a redundancy word line, the selected word line may be a normal word line corresponding to the input address ADD<0:A>. When a word line selected based on the input address ADD<0:A> is replaced by a redundancy word line, the selected word line may be the redundancy word line replaced for the selected word line based on the input address ADD<0:A>.

Hereinafter, a case where the memory performs a normal active operation and a case where the memory performs an active operation in a target refresh section (i.e. a target refresh operation) are described in detail.

Normal Active Operation

The control unit 360 may activate a word line when the active command ACT is activated. In this case, the control unit 360 may select a cell block and a word line to be activated based on the input address ADD<0:A>. The control unit 360 may select a word line or a redundancy word line based on the input address ADD<0:A>.

The control unit 360 may read or write data from or to a memory cell coupled to the activated word line when a read or write command is activated. When the precharge command PRE is activated after the read or write operation has been completed, the control unit 360 may precharge the activated word line.

Target Refresh Operation

During the target refresh operation, the memory may refresh one or more adjacent word lines which are adjacent to a word line selected based on a first input address ADD1<0:A>. When the selected word line is a $K^{th}$-disposed word line in a cell block, the one or more adjacent word lines may include a first adjacent word line which is $(K+1)^{th}$-disposed and a second adjacent word line which is $(K-1)^{th}$-disposed.

The mode setup unit 340 may activate the entry signal TRR_ENTRY in response to the input address ADD<0:A> when the mode setup command MODE_SET is activated. When the target refresh operation has been completed, the mode setup unit 340 may activate the termination signal TRR_EXIT in response to the input address ADD<0:A> when the mode setup command MODE_SET is activated. A method in which a memory enters a target refresh section and a method in which a memory terminates a target refresh section may vary depending on design, and a memory may directly enter a target refresh section or directly terminate a target refresh section using commands obtained by decoding command signals CMDs inputted from the outside.

After the memory enters the target refresh section, the command signals CMDs may be inputted to activate the active command ACT three times, and together with the command signals CMDs, first to third input addresses ADD1<0:A>, ADD2<0:A>, and ADD3<0:A> may be inputted sequentially. The second and third input addresses ADD2<0:A> and ADD3<0:A> may be the addresses of word lines adjacent to a word line corresponding to the first input address ADD1<0:A>. For example, when the first input address ADD1<0:A> corresponds to a $K^{th}$-disposed word line, the second input address ADD2<0:A> may correspond to a $(K+1)^{th}$-disposed word line, and the third input address ADD3<0:A> may correspond to a $(K-1)^{th}$-disposed word line.

The control unit 360 may select a cell block corresponding to the first input address ADD1<0:A>, of the first and second cell blocks BLK1 and BLK2, during the target refresh section. That is, the control unit 360 may maintain a state in which the cell block corresponding to the first input address ADD1<0:A> has been selected, regardless of the second and third input addresses ADD2<0:A> and ADD3<0:A>.

When the active command ACT is activated at first in the target refresh section, the control unit 360 may activate a word line selected based on the first input address ADD1<0:A>. Thereafter, when the precharge command PRE is activated, the activated word line may be precharged.

When a word line selected based on the first input address ADD1<0:A> is not adjacent to a redundancy word line, that is, when the selected word line is a word line except for the first word line WL1_2 of the first word line group WG1_N and the second word line WL2_2 of the second word line group WG2_N is described below, hereinafter, referred to as a "first case".

When second and third active commands ACTs are activated in the target refresh section, the control unit 360 may activate the word lines corresponding to the second and third input addresses ADD2<0:A> and ADD3<0:A>, respectively. Each activated word line is precharged when the respective precharge command PRE is activated. The word lines corresponding to the second and third input addresses ADD2<0:A> and ADD3<0:A> may be first and second adjacent word lines, respectively.

When the first and second adjacent word lines corresponding to the second and third input addresses ADD2<0:A> and ADD3<0:A> are replaced, the control unit 360 may not activate redundancy word lines which are replaced for the first and second adjacent word lines. This is because the redundancy word lines replaced for the first and second adjacent word lines are not adjacent to the word line selected based on the first input address ADD1<0:A>.

When a word line selected based on the first input address ADD1<0:A> is a last-disposed word line in a cell block, that is, when the selected word line is the first word line WL1_2 of the first word line group WG1_N or the second word line WL2_2 of the second word line group WG2_N is described below, hereinafter, referred to as a "second case".

In the second case, one or more adjacent word lines may include a first-disposed redundancy word line such as the first redundancy word line RWL1_1 of the first redundancy word line group RWG1_1 or the second redundancy word line RWL2_1 of the second redundancy word line group RWG2_1, hereinafter, referred to as a "first adjacent word line", and a word line prior to the last-disposed word line such as the first word line WL1_1 of the first word line group WG1_N or the second word line WL2_1 of the second word line group WG2_N, hereinafter, referred to as a "second adjacent word line".

When a second active command ACT is activated, the control unit 360 may activate the first adjacent word line, regardless of a second input address ADD2<0:A>. Thereafter, when the precharge command PRE is activated, the activated word line may be precharged. When a third active command ACT is activated, the control unit 360 may activate the second adjacent word line based on the third input address ADD3<0:A>. Thereafter, when the precharge command PRE is activated, the activated word line may be precharged.

When a word line selected based on the first input address ADD1<0:A> is a first-disposed redundancy word line in a cell block, that is, when the selected word line is the first redundancy word line RWL1_1 of the first redundancy word line group RWG1_1 or the second redundancy word line RWL2_1 of the second redundancy word line group RWG2_1 is described below, hereinafter, referred to as a "third case".

In the third case, one or more adjacent word lines may include a redundancy word line disposed after a first-disposed redundancy word line in a cell block such as the first redundancy word line RWL1_2 of the first redundancy word line group RWG1_1 or the second redundancy word line RWL2_2 of the second redundancy word line group RWG2_1, hereinafter, referred to as a "first adjacent word line", and a last-disposed word line in the cell block such as the first word line WL1_2 of the first word line group WG1_N or the second word line WL2_2 of the second word line group WG2_N, hereinafter, referred to as a "second adjacent word line".

When a word line selected based on the first input address ADD1<0:A> is a redundancy word line except for a first-disposed redundancy word line in a cell block, that is, when the selected word line is a redundancy word line except for the first redundancy word line RWL1_1 of the first redundancy word line group RWG1_1 and the second redundancy word line RWL2_1 of the second redundancy word line group RWG2_1 is described below, hereinafter, referred to as a "fourth case."

In the fourth case, one or more adjacent word lines may include redundancy word lines disposed before and after the redundancy word line selected based on the first input address ADD1<0:A> hereinafter, referred to as "first and second adjacent word lines", respectively.

In the third and fourth cases, when second and third active commands ACTs are activated, the control unit 360 may activate the first adjacent word line and the second adjacent word line, regardless of the second and third input addresses ADD2<0:A> and ADD3<0:A>.

As described above, when a word line selected based on the first input address ADD1<0:A> is adjacent to a redundancy word line, the memory may refresh a first adjacent word line and a second adjacent word line, without using the second input address ADD2<0:A> and the third input address ADD3<0:A>. Therefore, even when a word line corresponding to the first input address ADD1<0:A> is replaced, the target refresh operation may be normally performed. In addition, while the target refresh operation is performed, a state in which a cell block selected by the first input address ADD1<0:A> has been selected is maintained. Accordingly, even when an address corresponding to another cell block is inputted, the target refresh operation on the selected cell block may be normally performed.

FIG. 4 is a detailed block diagram illustrating the control unit 360 shown in FIG. 3.

As illustrated in FIG. 4, the control unit 360 may include an active control unit 410, a hit signal generation unit 420, a target refresh control unit 430, a word line control signal generation unit 440, a cell block selection unit 450 and 460, a first word line control unit 470, and a second word line control unit 480.

The active control unit 410 may generate an active signal RACT to control an active operation of a cell block selected from the first cell block BLK1 and the second cell block BLK2. The active control unit 410 may activate the active signal RACT when the active command ACT is activated, and may inactivate the active signal RACT when the precharge command PRE is activated. The active control unit 410 may generate an active pulse signal ACT_PUL. The active pulse signal ACT_PUL may be a pulse signal which is activated when a predetermined period of time has elapsed after the active command ACT is activated.

The cell block selection unit 450 and 460 may select a cell block, corresponding to the block selection bit ADD<A> of the address ADD<0:A>, from the first cell block BLK1 and the second cell block BLK2. The cell block selection unit 450 and 460 may select a cell block corresponding to the block selection bit ADD1<A> of the first input address ADD1<0:A> during a target refresh section. The cell block selection unit 450 and 460 may include a first cell block selection unit 450 and a second cell block selection unit 460.

The first cell block selection unit 450 may activate a first block signal BLK1_SEL when the first bit LAXA<0> of the decoded signal LAXA<0:1> or a first redundancy enable signal RXEN1 is activated. The first cell block selection unit 450 may update a state of the first block signal BLK1_SEL when a first target control signal RDECN_LAT is activated, and may maintain the state of the first block signal BLK1_SEL when the first target control signal RDECN_LAT is inactivated.

The second cell block selection unit 460 may activate a second block signal BLK2_SEL when the second bit LAXA<1> of the decoded signal LAXA<0:1> or a second redundancy enable signal RXEN2 is activated. The second cell block selection unit 460 may update a state of the second block signal BLK2_SEL when the first target control signal RDECN_LAT is activated, and may maintain the state of the second block signal BLK2_SEL when the first target control signal RDECN_LAT is inactivated.

The hit signal generation unit 420 generates a plurality of hit signals HIT1 to HIT8, BLK1_HIT, and BLK2_HIT. The hit signal generation unit 420 may activate a plurality of hit signals HIT1 to HIT8 and first and second block hit signals BLK1_HIT, and BLK2_HIT in response to the group selection bits ADD<1:A-1> of the address ADD<0:A>. The hit signal generation unit 420 may store one or more fail addresses, compare the group selection bits ADD<1:A-1> with the stored fail addresses, and activate one of the hit signals HIT1 to HIT8 when there is a fail address identical to the group selection bits ADD<1:A-1>.

The first to fourth hit signals HIT1 to HIT4 may correspond to the first redundancy word line groups RWG1_1 to RWG1_M, respectively, the fifth to eighth hit signals HIT5 to HIT8 may correspond to the second redundancy word line groups RWG2_1 to RWG2_M, respectively. For reference, the fail addresses may be the addresses of a word line group from which a defect is detected during a memory manufacturing procedure.

The hit signal generation unit 420 may activate the first block hit signal BLK1_HIT when any of the first to fourth hit signals HIT1 to HIT4 is activated, and may activate the second block hit signal BLK2_HIT when any of the fifth to eighth hit signals HIT5 to HIT8 is activated.

The target refresh control unit 430 may generate first to sixth target control signals RDECN_LAT, RDECM, RDECP, RDECN, TXRED, and LASTEN which are required for performing the target refresh operation.

The target refresh control unit 430 may activate the first target control signal RDECN_LAT during a normal active operation, and inactivate the first target control signal RDECN_LAT when entering a target refresh section while activating the first target control signal RDECN_LAT in response to the active pulse signal ACT_PUL only during a first refresh operation in the target refresh section. The first target control signal RDECN_LAT may be used to latch signals which are inputted or generated during the first refresh operation in the target refresh section.

When a word line selected by the first input address ADD1<0:A> in the target refresh section is a first-disposed redundancy word line RWL1_1 or RWL2_1 in each redundancy word line group (the third case), the target refresh control unit 430 may activate the second target control signal RDECM during a third refresh operation. When a word line selected by the first input address ADD1<0:A> in the target refresh section is a last-disposed redundancy word line RWL1_2 or RWL2_2 in each redundancy word line group, the target refresh control unit 430 may activate the third target control signal RDECP during a second refresh operation. The target refresh control unit 430 may activate the fourth target control signal RDECN in a section where the second target control signal RDECM and the third target control signal RDECP are inactivated.

In the second case, the target refresh control unit 430 may activate the fifth target control signal TXRED during the second refresh operation. The fifth target control signal TXRED may be used to activate a redundancy word line of a cell block which is selected in the second case. In the third case, the target refresh control unit 430 may activate the sixth target control signal LASTEN during the second refresh operation. The sixth target control signal LASTEN may be used to activate a normal word line of a cell block which is selected in the third case.

In response to the first to eighth hit signals HIT1 to HIT8, the first and second block hit signals BLK1_HIT and BLK2_HIT, the decoded signals LAX0<0:1> and LAX<0:B>, and the first to sixth target control signals RDECN_LAT, RDECM, RDECP, RDECN, TXRED, and LASTEN, the word line control signal generation unit 440 may generate a plurality of word line control signals NXE, RAX<0:3>, BAX0<0:1>, and BAX<0:B> for controlling a plurality of word lines WL1_1, WL1_2, WL2_1, and WL2_2 and a plurality of redundancy word lines RWL1_1, RWL1_2, RWL2_1, and RWL2_2.

The first word line control signal NXE may be activated when a selected word line in a cell block is not replaced by a redundancy word line, and is inactivated when the selected word line is replaced by a redundancy word line. The plurality of third word line control signals BAX0<0:1> and BAX<0:B> are used to select one of the word lines including the redundancy word lines, in the cell block.

The first word line control unit 470 may activate a word line selected in response to the plurality of third word line control signals BAX0<0:1> and BAX<0:B> when the first block signal BLK1_SEL is activated. The first word line control unit 470 may include a first redundancy control unit 471 and a first word line driver 472. The first redundancy control unit 471 may generate the first redundancy enable signal RXEN1 in response to the first block hit signal BLK1_HIT and the first target control signal RDECN_LAT, and may generate a first redundancy word line enable signal RWEN1 in response to the active signal RACT, the first redundancy enable signal RXEN1, the fifth target control signal TXRED, the sixth target control signal LASTEN, and the active pulse signal ACT_PUL. The first word line driver 472 may activate a word line selected in response to the plurality of third word line control signals BAX0<0:1> and BAX<0:B> when the first redundancy word line enable signal RWEN1 is inactivated, and may activate a redundancy word line selected in response to the plurality of third word line control signals BAX0<0:1> and BAX<0:B> when the first redundancy word line enable signal RWEN1 is activated.

The second word line control unit 480 may activate a word line selected in response to the plurality of third word line control signals BAX0<0:1> and BAX<0:B> when the second block signal BLK2_SEL is activated. The second word line control unit 480 may include a second redundancy control unit 481 and a second word line driver 482. The second redundancy control unit 481 may generate the second redundancy enable signal RXEN2 in response to the second block hit signal BLK2_HIT and the first target control signal RDECN_LAT, and may generate a second redundancy word line enable signal RWEN2 in response to the active signal RACT, the second redundancy enable signal RXEN2, the fifth target control signal TXRED, the sixth target control signal LASTEN, and the active pulse signal ACT_PUL. The second word line driver 482 may activate a word line selected in response to the plurality of third word line control signals BAX0<0:1> and BAX<0:B> when the second redundancy word line enable signal RWEN2 is inactivated, and may activate a redundancy word line selected in response to the plurality of third word line control signals BAX0<0:1> and BAX<0:B> when the second redundancy word line enable signal RWEN2 is activated.

Figure 5:
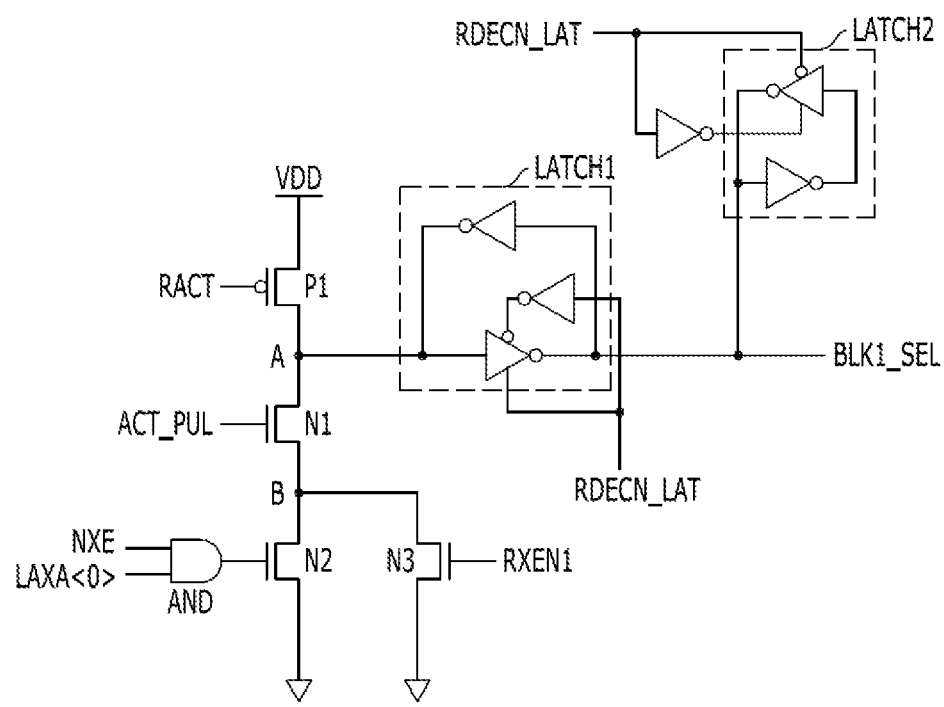
FIG. 5 is a detailed block diagram illustrating a cell block selection unit show in FIG. 4.

FIG. 5 is a detailed block diagram illustrating the first cell block selection unit 450 shown in FIG. 4. In FIG. 5, since the second cell block selection unit 460 has substantially the same structures as that of the first cell block selection unit 450, the first cell block selection unit 450 is described in FIG. 5 as an example.

As illustrated in FIG. 5, the first cell block selection unit 450 may include latches LATCH1 and LATCH2, transistors P1, N1, N2, and N3.

When an active operation and a target refresh operation are not performed, the active signal RACT is inactivated, and the transistor P1 is turned on so as to precharge a node A to a high level. When the active operation or the target refresh operation is performed, the active signal RACT is activated, and the transistor P1 is turned off so as to determine a voltage of the node A in response to a voltage of a node B.

When the first word line control signal NXE is activated and the first bit LAXA<0> of the decoded signal LAXA<0:1> is activated, the transistor N2 is turned on and thus the node B may be pulled down to a low level. When the first redundancy enable signal RXEN1 is activated, the transistor N3 is turned on thus the node B may be pulled down to a low level. When the transistors N2 and N3 are both turned off, the node B is floated. When the node B has been pulled down, the node A may be pulled down to a low level in a state that the active pulse signal ACT_PUL is activated. When the node B is floated, the voltage of the node A may be maintained at a high level in a state that the active pulse signal ACT_PUL is activated.

When the first target control signal RDECN_LAT is activated, the latch LATCH1 is activated to invert and transfer the voltage of the node A as the first block signal BLK1_SEL, and the latch LATCH2 is inactivated. When the first target control signal RDECN_LAT is inactivated, the latch LATCH1 is inactivated, and the latch LATCH2 is activated to maintain the state of the first block signal BLK1_SEL. Accordingly, when the voltage of the node A is a low level in a state that the first target control signal RDECN_LAT is activated, the first block signal BLK1_SEL is activated to a high level. When the voltage of the node A is a high level in a state that the first target control signal RDECN_LAT is activated, the first block signal BLK1_SEL is inactivated to a low level.

Figure 6:
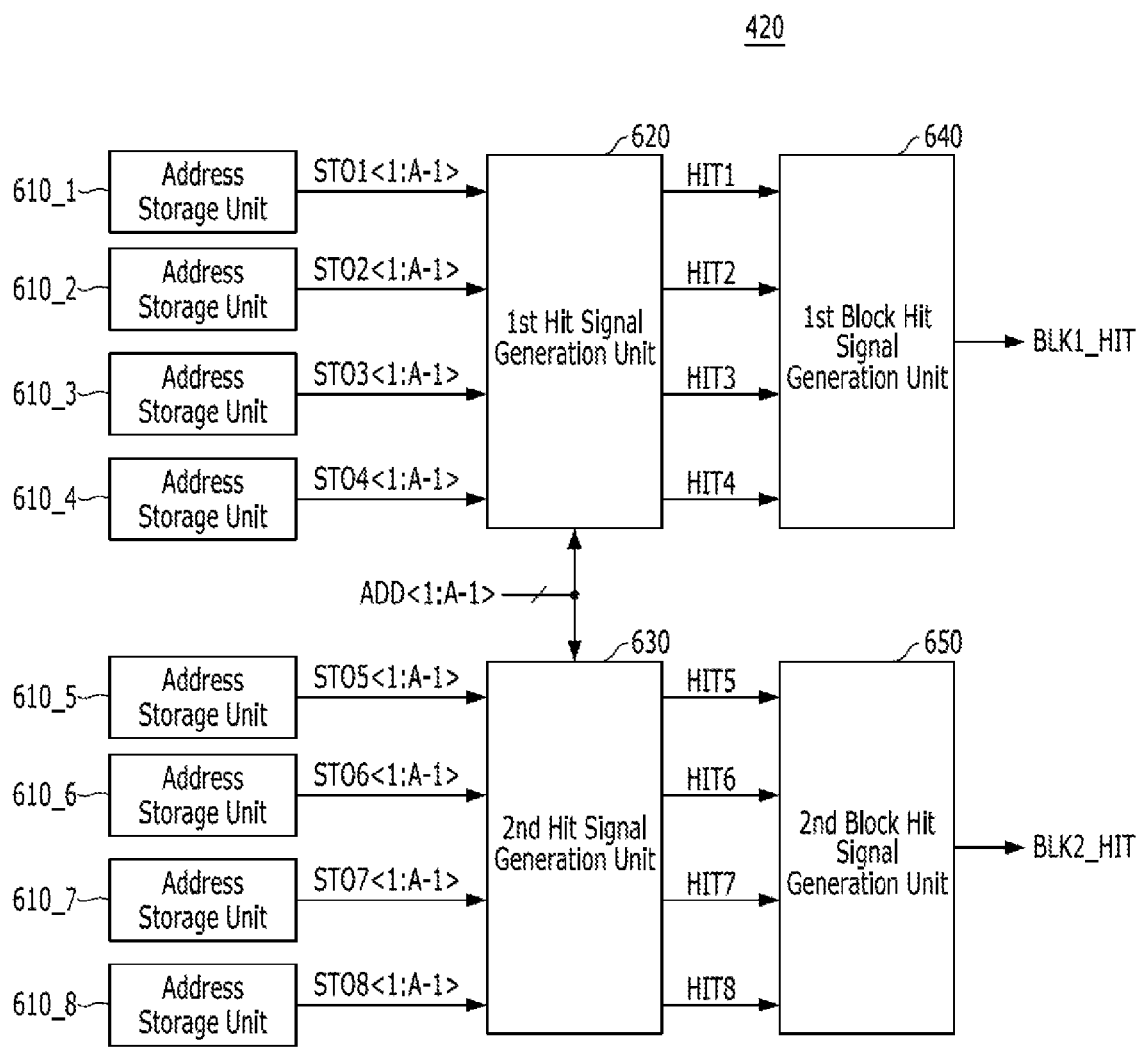
FIG. 6 is a detailed block diagram illustrating a hit signal generation unit show in FIG. 4.

FIG. 6 is a detailed block diagram illustrating the hit signal generation unit 420 shown in FIG. 4.

As illustrated in FIG. 6, the hit signal generation unit 420 may include a plurality of address storage units 610_1 to 610_8, a first hit signal generation unit 620, a second hit signal generation unit 630, a first block hit signal generation unit 640, and a second block hit signal generation unit 650.

Each of the plurality of address storage units 610_1 to 610_8 may store an address of a word line group to be replaced, and may output stored values STO1<1:A−1> to STO8<1:A−1>.

The first hit signal generation unit 620 may generate the first to fourth hit signals HIT1 to HIT4 by comparing the values STO1<1:A−1> to STO4<1:A−1> stored in the address storage units 610_1 to 610_8 with the group selection bits ADD<1:A−1>. The first hit signal generation unit 620 may activate the first hit signal HIT1 when the group selection bits ADD<1:A−1> are the same as the values STO1<1:A−1>, activate the second hit signal HIT2 when the group selection bits ADD<1:A−1> are the same as the values STO2<1:A−1>, activate the third hit signal HIT3 when the group selection bits ADD<1:A−1> are the same as the values STO3<1:A−1>, and activate the fourth hit signal HIT4 when the group selection bits ADD<1:A−1> are the same as the value STO4<1:A−1>. When any of the hit signals HIT1 to HIT4 is activated, the first block hit signal generation unit 640 may activate the first block hit signal BLK1_HIT.

The second hit signal generation unit 630 may generate the fifth to eighth hit signals HIT5 to HIT8 by comparing the values STO5<1:A−1> to STO8<1:A−1> stored in the address storage unit with the group selection bits ADD<1:A−1>. The second hit signal generation unit 630 may activate the fifth hit signal HIT5 when the group selection bits ADD<1:A−1> are the same as the values STO5<1:A−1>, activate the sixth hit signal HIT6 when the group selection bits ADD<1:A−1> are the same as the values STO6<1:A−1>, activate the seventh hit signal HIT7 when the group selection bits ADD<1:A−1> are the same as the values STO7<1:A−1>, and activate the eighth hit signal HIT8 when the group selection bits ADD<1:A−1> are the same as the values STO8<1:A−1>. When any of the hit signals HIT5 to HIT8 are activated, the second block hit signal generation unit 650 may activate the second block hit signal BLK2_HIT.

Figure 7:
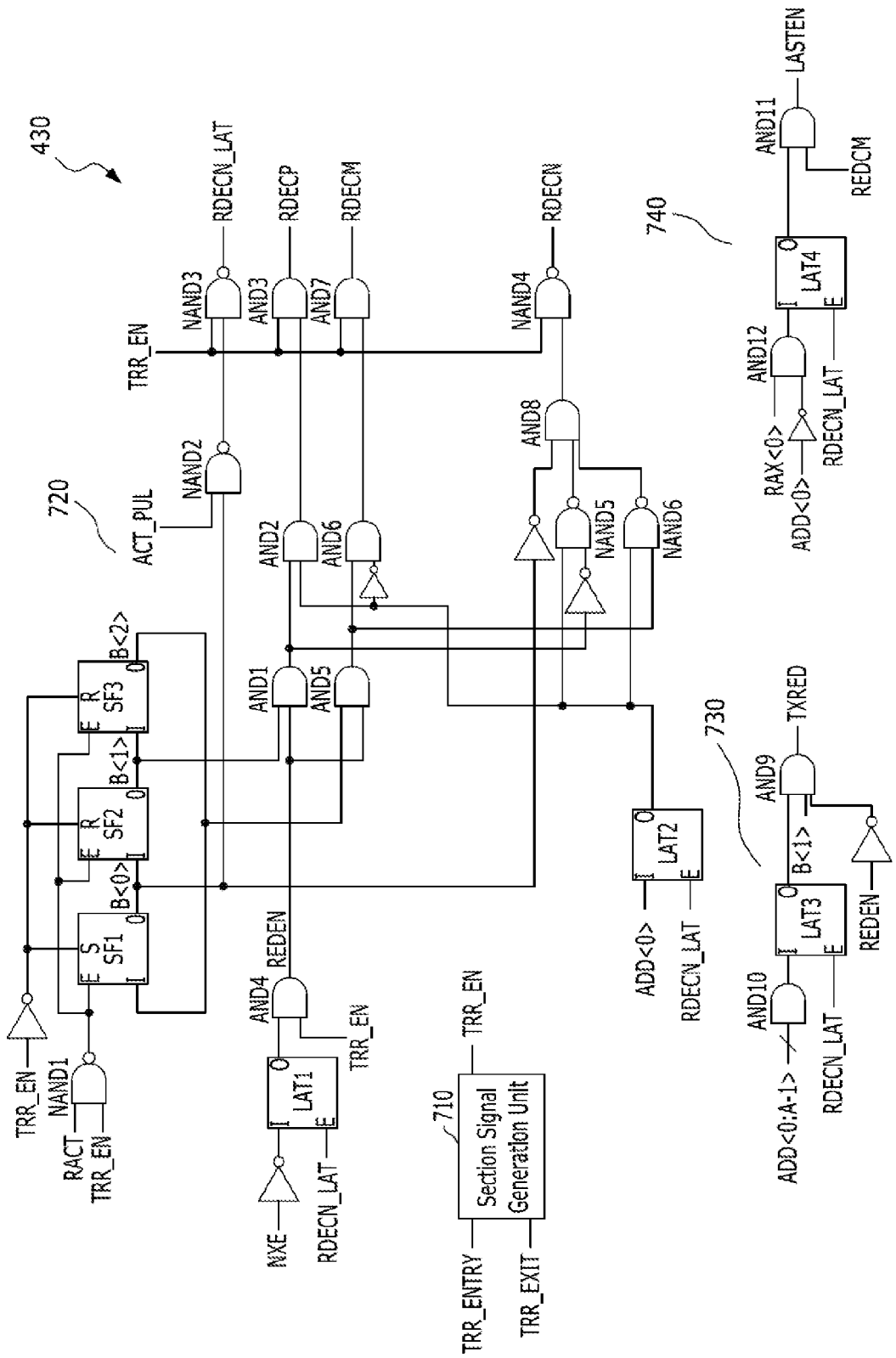
FIG. 7 is a detailed block diagram illustrating a target refresh control unit show in FIG. 4.

FIG. 7 is a detailed block diagram illustrating the target refresh control unit 430 shown in FIG. 4.

As illustrated in FIG. 7, the target refresh control unit 430 may include a section signal generation unit 710 and first to third target control signal generation units 720, 730, and 740.

The section signal generation unit 710 may activate a section signal TRR_EN denoting a target refresh section when the entry signal TRR_ENTRY is activated, and may inactivate the section signal TRR_EN when the termination signal TRR_EXIT is activated.

The first target control signal generation unit 720 may generate the first to fourth target control signals RDECN_LAT, RDECM, RDECP, and RDECN in response to the section signal TRR_EN, the active signal RACT, the first word line control signal NICE, the active pulse signal ACT_PUL, and the lowest bit ADD<0> of the address ADD<0:A>. The first target control signal generation unit 720 may include a plurality of shifting units SF1 to SF3, a plurality of latch units LAT1 and LAT2, and a plurality of gates AND1 to AND8 and NAND1 to NAND5. For reference, in the shifting units SF1 to SF3, "I" may represent an input terminal, "O" may represent an output terminal, "E" may represent an enable terminal, "S" may represent a set terminal, making an output value of high, and "R" may represent a reset terminal, making an output value of low. In the latch units LAT1 to LAT4, "I" may represent an input terminal, "O" may represent an output terminal, and "E" may represent an enable terminal. In each of the latch units LAT1 to LAT4, when the enable terminal E thereof is activated, a signal inputted through the input terminal I is latched to be outputted as a latched value to the output terminal O; and when the enable terminal E is inactivated, a latched value of the output terminal O is maintained.

When the section signal TRR_EN is inactivated to a low level, the plurality of shifting units SF1 to SF3 do not perform a shifting operation, and output values B<0>, B<1>, and B<2> outputted through the output terminals O of the plurality of shifting units SF1 to SF3 may be HIGH, LOW, and LOW, respectively. When the section signal TRR_EN is activated, the plurality of shifting units SF1 to SF3 may perform a shifting operation in response to the active signal RACT. The plurality of shifting units SF1 to SF3 may output the output values B<0>, B<1>, and B<2> as HIGH, LOW, and LOW during a first refresh operation; output the output values B<0>, B<1>, and B<2> as LOW, HIGH, and LOW during a second refresh operation, and output the output values B<0>, B<1>, and B<2> as LOW, LOW, and HIGH during a third refresh operation.

When the section signal TRR_EN is inactivated to a low level, the gate NAND3 outputs the first target control signal RDECN_LAT activated to a high level, regardless of the output of the gate NAND2. When the section signal TRR_EN is activated to a high level and the output value B<0> of the first shifting unit SF1 is a high level, the first target control signal RDECN_LAT may be activated in a section where the active pulse signal ACT_PUL has been activated. Accordingly, the first target control signal RDECN_LAT may be activated in a section other than a target refresh section, may be inactivated on an entry into the target refresh section, then may be activated during the first refresh operation in the target refresh section.

When the section signal TRR_EN is inactivated, an intermediate signal REDEN may be a low level, and when the section signal TRR_EN is activated, the intermediate signal REDEN may be a low level when a word line selected based on the first input address ADD1<0:A> is a normal word line, and may be a high level when a word line selected based on the first input address ADD1<0:A> is a redundancy word line. When the first target control signal RDECN_LAT is activated, the latch unit LAT1 may latch an inverted value of the first word line control signal NXE, and may output the latched value. The intermediate signal REDEN may be a low level when the section signal TRR_EN is inactivated to a low level, and may have the same value as the latched value of the latch unit LAT1 when the section signal TRR_EN is activated to a high level.

When the first target control signal RDECN_LAT is is activated, the latch unit LAT2 may latch the lowest bit ADD<0> and output the latched value. Therefore, the latched value of the latch unit LAT2 may be the same as the lowest bit ADD<0> in a section other than the target refresh section, and may be the same as the lowest bit ADD1<0> of the first input address ADD1<0:A> in the target refresh section.

When the section signal TRR_EN is inactivated, the gates AND7 and AND3 output the second and third target control signals RDECM and RDECP inactivated to a low level, regardless of outputs of the gates AND2 and AND6, respectively. In the case where the section signal TRR_EN is activated, when the intermediate signal REDEN is a high level, and the latched value of the latch unit LAT2 is a low level (i.e. a word line corresponding to a first input address ADD1<0:A> is a first-disposed word line in a word line group), the second target control signal RDECM may be activated to a high level in a section in which the output value B<2> of the third shifting unit SF3 is a high level. When the section signal TRR_EN is activated, the intermediate signal REDEN is a high level, and the latched value of the latch unit LAT2 is a high level (i.e. a word line corresponding to the first input address ADD1<0:A> is a last-disposed word line in a word line group), the third target control signal RDECP may be activated to a high level in a section in which the output value B<1> of the second shifting unit SF2 is a high level.

Therefore, the second and third target control signals is RDECM and RDECP may be inactivated in a section other than the target refresh section. When a word line corresponding to a first input address ADD1<0:A> is replaced in a target refresh section, the second target control signal RDECM may be activated during a third refresh operation when the word line corresponding to the first input address ADD1<0:A> is a first-disposed word line in a word line group, and the third target control signal RDECP may be activated during a second refresh operation when the word line corresponding to the first input address ADD1<0:A> is a last-disposed word line in a word line group.

The first target control signal generation unit 720 may activate the fourth target control signal RDECN when the second target control signal RDECM and the third target control signal RDECP are inactivated.

The second target control signal generation unit 730 may include a latch unit LAT3 and a plurality of gates AND9 and AND10. The gate AND10 may detect a case where a word line selected based on the input address ADD<0:A> is a last-disposed word line in a cell block. For example, when word lines have address values increasing one by one in order of position, word line selection bits ADD<0:A−1> of a last-disposed word line in a cell block may be the maximum value. That is, when the values of all of the word line selection bits ADD<0:A−1> of a last-disposed word line in a cell block are high, an output of the gate AND10 may be activated to a high level. The gate AND10 may be replaced by another circuit which activates an output thereof when the value of the word line selection bits ADD<0:A−1> corresponds to a last-disposed word line in a cell block. When the first target control signal RDECN_LAT is activated, the latch unit LAT3 may latch the output of the gate AND10 and output the latched value. When the intermediate signal REDEN is low and the output value B<1> of the second shifting unit SF2 is high, the gate AND9 may transfer the latched value of the latch unit LAT3 as the fifth target control signal TXRED.

Therefore, when a word line selected based on a first input address ADD1<0:A> is a last-disposed word line such as the first word line WL1_2 of the first word line group WG1_N or the second word line WL2_2 of the second word line group WG2_N in a cell block, the fifth target control signal TXRED may be activated during a second refresh operation.

The third target control signal generation unit 740 may include a latch unit LAT4 and a plurality of gates AND11 and AND12. The gate AND12 may detect a case where a word line selected based on the input address ADD 0:A> is a first-disposed redundancy word line in a cell block. When a first bit RAX<0> of the second word line control signal RAX<0:3> corresponding to a first-disposed redundancy word line group RWG1_1 or RWG2_1 in a cell block is activated to a high level, and the lowest bit ADD<0> corresponds to a first-disposed word line in a word line group, i.e., ADD<0>=0, the gate AND12 may activate the output thereof. When the first target control signal RDECN_LAT is activated, the latch unit LAT4 may latch the output of the gate AND12 and output the latched value. When the second target control signal RDECM is activated, the gate AND11 may transfer the latched value of the latch unit LAT4 as the sixth target control signal LASTEN.

Therefore, when a word line selected based on a first input address ADD1<0:A> is a first-disposed redundancy word line in a cell block, the sixth target control signal LASTEN may be activated during a third refresh operation.

Figure 8:
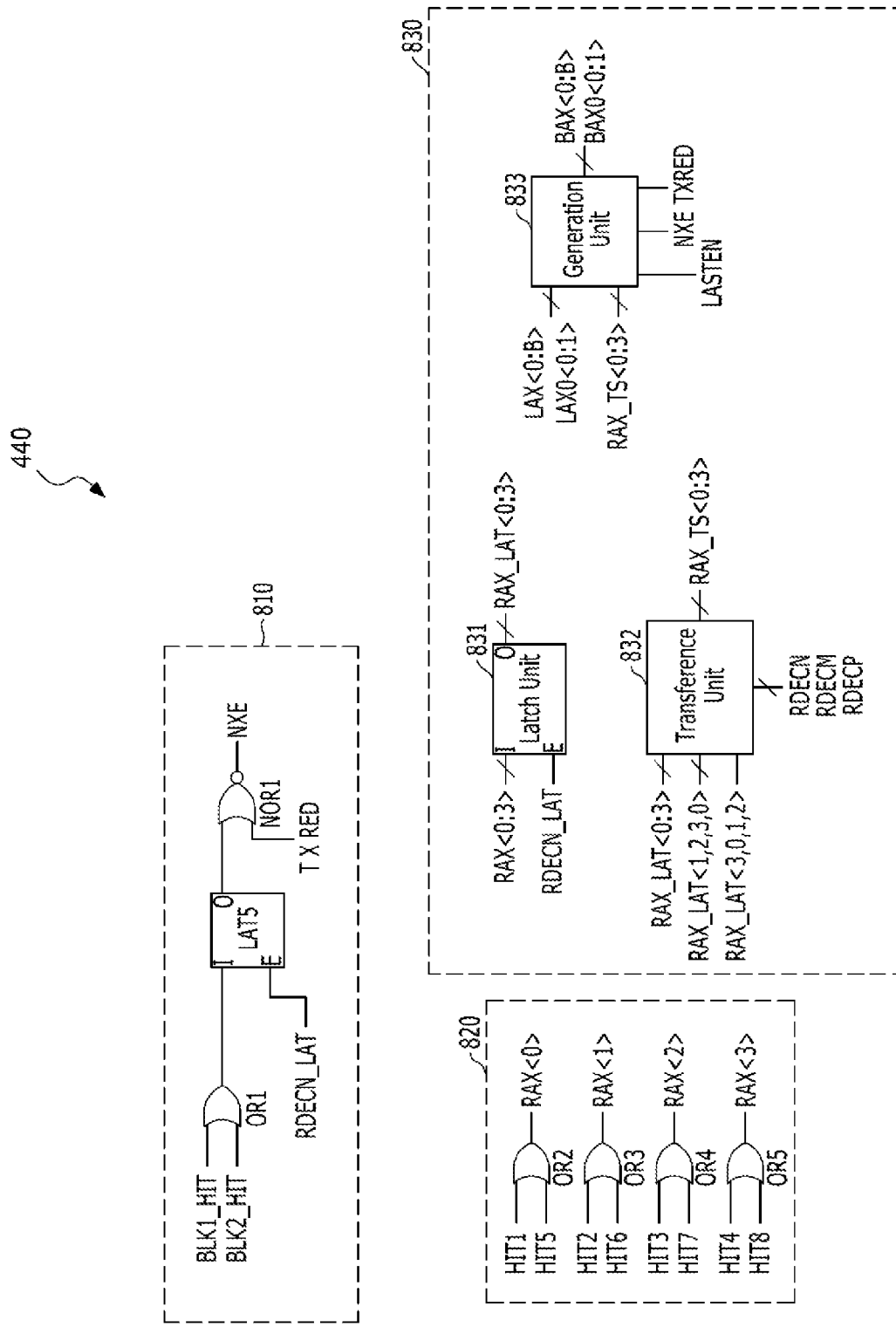
FIG. 8 is a detailed block diagram illustrating a word line control signal generation unit show in FIG. 4.

FIG. 8 is a detailed block diagram illustrating the word line control signal generation unit 440 shown in FIG. 4.

As illustrated in FIG. 8, the word line control signal generation unit 440 may include first to third word line control signal generation units 810 to 830.

The first word line control signal generation unit 810 may include a latch unit LAT1 and a plurality of gates OR1 and NOR1. An output of the gate OR1 may be activated to a high level when the first block hit signal BLK1_HIT or second block hit signal BLK2_HIT is activated to a high level. Therefore, when a word line corresponding to the input address ADD<0:A> is replaced in the first cell block BLK1 or the second cell block BLK2, the output of the gate OR1 may be activated. When the first target control signal RDECN_LAT is activated, the latch unit LAT1 may latch the output of the gate OR1 and output the latched value. That is, the latch unit LAT1 may latch the first block hit signal BLK1_HIT or the second block hit signal BLK2_HIT when the first target control signal RDECN_LAT is activated. The gate NOR1 may invert and transfer the latched value of the latch unit LAT1 as the first word line control signal NXE when the fifth target control signal TXRED is inactivated to a low level, and may inactivate the first word line control signal NXE to low when the fifth target control signal TXRED is activated to a high level.

Therefore, the first word line control signal NXE is a signal denoting whether or not a normal word line is to be activated in a selected cell block, wherein the first word line control signal NXE may be activated when a normal word line is activated, and may be inactivated when a normal word line is inactivated (low), i.e., when a redundancy word line is activated.

The second word line control signal generation unit 820 may generate the second word line control signal RAX<0:3> having multiple bits in response to the hit signals HIT1 to HIT8. The second word line control signal generation unit 820 may include a plurality of gates OR2 to OR5. The gate OR2 may activate the first bit RAX<0> to high when the first hit signal HIT1 or the fifth hit signal HIT5 is activated, the gate OR3 may activate the second bit RAX<1> to high when the second hit signal HIT2 or the sixth hit signal HIT6 is activated, the gate OR4 may activate the third bit RAX<2> to high when the third hit signal HIT3 or the seventh hit signal HIT7 is activated, and the gate OR5 may activate the fourth bit RAX<3> to high when the fourth hit signal HIT4 or the eighth hit, signal HIT8 is activated.

The first to fourth bits RAX<0> to RAX<3> of the second word line control signal corresponds to the first and second redundancy word line groups RWG1_1 to RWG1_M and RWG2_1 to RWG2_M, respectively, in a cell block. The first bit RAX<0> may correspond to the first and second redundancy word line groups RWG1_1 and RWG2_1 the second bit RAX<1> may correspond to the first and second redundancy word line groups RWG1_2 and RWG2_2, the third bit RAX<2> may correspond to the first and second redundancy word line groups RWG1_3 and RWG2_3, and the fourth bit RAX<3> may correspond to the first and second redundancy word line groups RWG1_4 and RWG2_4, i.e. a case wherein M=4.

The third word line control signal generation unit 830 may include a latch unit 831, a transference unit 832, and a generation unit 833. The latch unit 831 may latch and output the second word line control signal RAX<0:3> as the latched second word line control signal RAX_LAT<0:3> in response to the first target control signal RDECN_LAT. Accordingly, in a section other than a target refresh section, the value of the latched second word line control signal RAX_LAT<0:3> is updated whenever a word line is activated; while in a target refresh section, the value of the latched second word line control signal RAX_LAT 0:3> may be maintained at a value which is determined during a first refresh operation.

The transference unit 832 may transfer the latched second word line control signal RAX_LAT<0:3> as a transfer signal RAX_TS<0:3> according to a relation which is set in response to the second to fourth control signals RDECM, RDECP, and RDECN. As shown in table 1, the transference unit 832 may transfer the latched second word line control signal RAX_LAT<0:3> as the transfer signal RAX_TS<0:3>.

TABLE 1

|  | RDECN activated | RDECP activated | RDECM activated |
|---|---|---|---|
| RAX_LAT<0> | RAX_TS<0> | RAX_TS<1> | RAX_TS<3> |
| RAX_LAT<1> | RAX_TS<1> | RAX_TS<2> | RAX_TS<0> |
| RAX_LAT<2> | RAX_TS<2> | RAX_TS<3> | RAX_TS<1> |
| RAX_LAT<3> | RAX_TS<3> | RAX_TS<0> | RAX_TS<2> |

The generation unit 833 may transfer the decoded signals LAX<0:1> and LAX<0:B>, and the transfer signal RAX_TS<0:3> as the plurality of third word line control signals BAX0<0:1> and BAX<0:B> according to a relation which is determined in response to the first word line control signal NXE, the fifth target control signal TXRED and the sixth target control signal LASTEN.

When the first word line control signal NXE is activated, the generation unit 833 may transfer the decoded signals LAX<0:1> and LAX<0:B> as the third word line control signals BAX0<0:1> and BAX<0:B>. When the first word line control signal NXE is inactivated, the generation unit 833 may transfer the decoded signal LAX0<0:1> and the transfer signal RAX_TS<0:3> as the third word line control signals BAX0<0:1> and BAX<0:3>, respectively. When the fifth target control signal TXRED is activated, the generation unit 833 may activate the third word line control signals, e.g., BAX0<0> and BAX<0>, corresponding to a first-disposed redundancy word line in a cell block, from among the third word line control signals BAX0<0:1> and BAX<0:B>. When the sixth target control signal LASTEN is activated, the generation unit 833 may activate the third word line control signals, e.g., BAX0<1> and a part of BAX<0:B>, corresponding to a last-disposed redundancy word line in a cell block, from among the third word line control signals BAX0<0:1> and BAX<0:B>.

Figure 9:
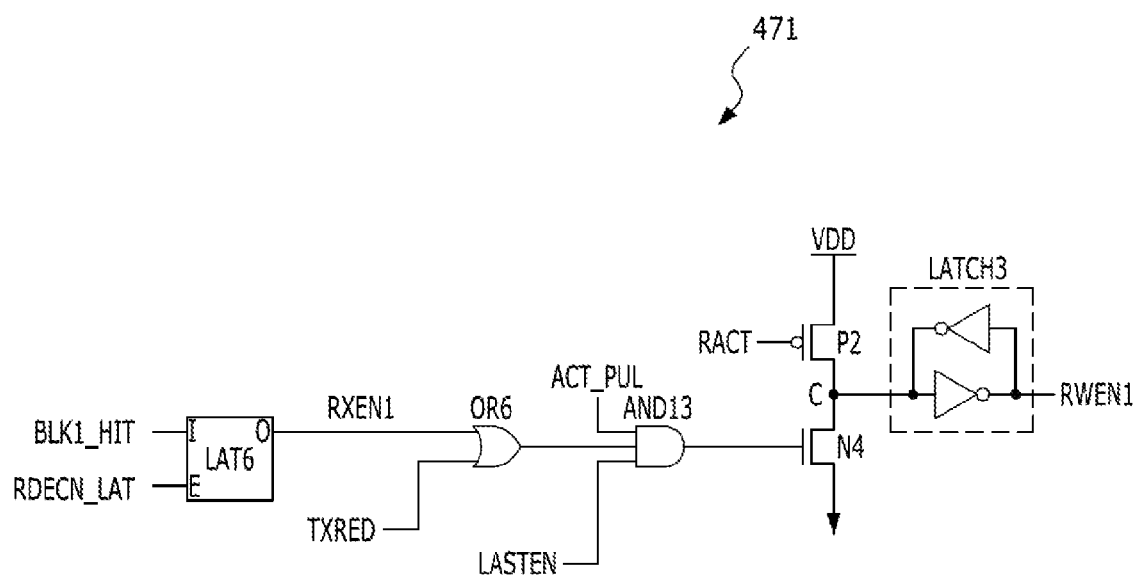
FIG. 9 is a block diagram illustrating a redundancy control unit show in FIG. 4.

FIG. 9 is a detailed block diagram illustrating the first redundancy control unit 471 shown in FIG. 4. In FIG. 9, since the second redundancy control unit 472 has substantially the same structures as that of the first redundancy control unit 471, the first redundancy control unit 471 is described in FIG. 9 as an example.

As illustrated in FIG. 9, the first redundancy control unit 471 may include a latch unit LAT6, a latch LATCH3, a plurality of gates OR6 and AND13, and a plurality of transistors P2 and N4.

When an active operation or a target refresh operation is not performed, the active signal RACT is inactivated and the transistor P2 is turned on so that a node C may be precharged to high. When the active operation or the target refresh operation is performed, the active signal RACT is activated and the transistor P2 is turned off so that a voltage of the node C may be determined depending on whether or not the transistor N4 is turned on. When the transistor N4 is turned on, the node C is pulled down so that the first redundancy word line enable signal RWEN1 may be activated to a high level. When the transistor N4 is turned off, the node C is maintained at a precharge state so that the first redundancy word line enable signal RWEN1 may be inactivated to a low level.

When a first target control signal RDECN_LAT is activated, the latch unit LATE may latch the first block hit signal BLK1_HIT and output the first redundancy enable signal RXEN1. When any of the first redundancy enable signal RXEN1 and the fifth target control signal TXRED is activated to a high level, the gate OR6 may output high. When an output of the gate OR6 is high and the sixth target control signal LASTEN is inactivated to a low level, the gate AND13 outputs high during a section where the active pulse ACT_PUL is activated a high level. The transistor N4 is turned on in a section where an output of the gate AND13 is high.

Therefore, when the first redundancy enable signal RXEN1 is activated or when the fifth target control signal TXRED is activated, the first redundancy control unit 471 activates the first redundancy word line enable signal RWEN1 in response to the active pulse ACT_PUL, and inactivates the first redundancy word line enable signal RWEN1 when the sixth target control signal LASTEN is activated. In such a manner, the first redundancy word line enable signal RWEN1 may be activated only when a redundancy word line in a first cell block BLK1 is activated.

Where the first block signal BLK1_SEL is activated and the first redundancy word line enable signal RWEN1 is inactivated, the first word line driver 472 may activate a word line selected by the third word line control signals BAX0<0:1> and BAX<0:B>; and when the first redundancy word line enable signal RWEN1 is activated, the first word line driver 472 may activate a redundancy word line selected by the plurality of third word line control signals BAX0<0:1> and BAX<0:B>.

An operation of the memory will be described below with reference to FIGS. 3 to 9. In the following description, it is presumed that the first cell block BLK1 is selected.

Normal Active Operation

Since it is not a target refresh section, the target refresh control unit 430 may activate the first target control signal RDECN_LAT and the fourth target control signal RDECN, and may inactivate the second target control signal RDECM, the third target control signal RDECP, the fifth target control signal TXRED, and the sixth target control signal LASTEN.

When a word line corresponding to the input address ADD<0:A> is not replaced, the hit signal generation unit 420 may inactivate all the hit signals HIT1 to HIT8, BLK1_HIT1, and BLK2_HIT, the word line control signal generation unit 440 may activate the first word line control signal NXE, and generate the third word line control signals BAX0<0:1> and BAX<0:B> based on the decoded signals LAX0<0:1> and LAX<0:B>. The first cell block selection unit 450 may activate the first block signal BLK1_SEL in response to the first word line control signal NXE and the first bit LAXA<0> of the decoded signal LAXA<0:1>. The first redundancy control unit 471 may inactivate the first redundancy word line enable signal RWEN1. Since the first redundancy word line enable signal RWEN1 is inactivated, the first word line driver 472 may activate a word line selected in response to the plurality of third word line control signals BAX0<0:1> and BAX<0:B>.

When a word line corresponding to the input address ADD<0:A> is replaced, wherein it is presumed that the word line is replaced by the first redundancy word line RWL1_2 of the first redundancy word line group RWG1_1), the hit signal generation unit 420 activates the first hit signal HIT1 and the first block hit signal BLK1_HIT, the word line control signal generation unit 440 may inactivate the first word line control signal NXE and activate the first bit RAX<0> of the second word line control signal RAX<0:3>. The word line control signal generation unit 440 may transfer the second word line control signal RAX0<0:3> as the third word line control signals BAX<0:3> via the latched second word line control signal RAX_LAT<0:3> and the transfer signal RAX_TS<0:3>, and transfer the decoded signal LAX0<0:1> as the third word line control signal BAX0<0:1>. The first redundancy control unit 471 may latch the first block hit signal BLK1_HIT to activate the first redundancy enable signal RXEN1, and activate the first redundancy word line enable signal RWEN1. The first cell block selection unit 450 may activate the first block signal BLK1_SEL in response to the first redundancy enable signal RXEN1. Since the first redundancy word line enable signal RWEN1 is activated, the first word line driver 472 may activate a redundancy word line selected in response to the plurality of third word line control signals BAX0<0:1> and BAX<0:3>.

Target Refresh Operation

First Target Refresh Example

The hit signal generation unit 420 may inactivate all the hit signals HIT1 to HIT8, BLK1_HIT1, and BLK2_HIT. The target refresh control unit 430 may inactivate the first target control signal RDECN_LAT on an entry into a target refresh section, and may activate the first target control signal RDECN_LAT in the form of a pulse and activate the fourth target control signal RDECN during a first refresh operation.

The word line control signal generation unit 440 may activate the first word line control signal NXE during the first refresh is operation, and maintain the activated state during the target refresh section. Accordingly, the word line control signal generation unit 440 may transfer the decoded signals LAX0<0:1> and LAX<0:B> as the third word line control signals BAX0<0:1> and BAX<0:B> during the first to third refresh operations.

The first cell block selection unit 450 may activate the first block signal BLK1_SEL in response to the first word line control signal NXE and the first bit LAXA<0> of the decoded signal LAXA<0:1> during the first refresh operation, and maintain the activated state during the target refresh section. The first redundancy control unit 471 may inactivate the first redundancy enable signal RXEN1 and the first redundancy word line enable signal RWEN1 during the first refresh operation, and maintain the inactivated state during the target refresh section.

Since the first redundancy word line enable signal RWEN1 is inactivated, the first word line driver 472 may activate a word line selected in response to the third word line control signals BAX0<0:1> and BAX<0:B> during the first to third refresh operations.

Second Target Refresh Example

The hit signal generation unit 420 may inactivate all the hit signals HIT1 to HIT8, BLK1_HIT1, and BLK2_HIT. The target refresh control unit 430 may inactivate the first target control signal RDECN_LAT on an entry into a target refresh section, may activate the first target control signal RDECN_LAT in the form of a pulse and activate the fourth target control signal RDECN during a first refresh operation, and may activate the fifth target control signal TXRED during a second refresh operation.

The word line control signal generation unit 440 activates the first word line control signal NXE during the first and third refresh operations, and inactivates the first word line control signal NXE in response to the fifth target control signal TXRED only during the second refresh operation. During the first and third refresh operations, the word line control signal generation unit 440 may transfer the decoded signals LAX0<0:1> and LAX<0:B> as the third word line control signals BAX0<0:1> and BAX<0:B>. During the second refresh operation, the word line control signal generation unit 440 may activate the third word line control signals BAX0<0> and BAX<0> corresponding to a first-disposed redundancy word line such as the first redundancy word line RWL1_1 of the first redundancy word line group RWG1_1 in the first cell block BLK1.

The first redundancy control unit 471 may inactivate the first redundancy word line enable signal RWEN1 during the first and third refresh operations, and may inactivate the first redundancy word line enable signal RWEN1 in response to the fifth target control signal TXRED during the second refresh operation. The first cell block selection unit 450 may activate the first block signal BLK1_SEL in response to the first word line control signal NXE and the first bit LAXA<0> of the decoded signal LAXA<0:1> during the first refresh is operation, and maintain the activated state during the target refresh section.

During the first and third refresh operations, since the first redundancy word line enable signal RWEN1 is inactivated, the first word line driver 472 may activate word lines such as the first word lines WL1_1 and WL1_2 of the first word line group WG1_N, selected in response to the third word line control signals BAX0<0:1> and BAX<0:B>. During the second refresh operation, since the first redundancy word line enable signal RWEN1 is activated, the first word line driver 472 may activate a redundancy word line such as the first redundancy word line RWL1_1 of the first redundancy word line group RWG1_1", selected in response to the third word line control signals BAX0<0:1> and BAX<0:3>.

Third Target Refresh Example

A third example describes processing when a word line selected based on a first input address ADD1<0:A> is a first-disposed redundancy word line in a cell block.

The hit signal generation unit 420 may activate the first hit signal HIT1 and the first block hit signal BLK1_HIT during a first refresh operation. The target refresh control unit 430 may inactivate the first target control signal RDECN_LAT on an entry into a target refresh section, activate the first target control signal RDECN_LAT in the form of a pulse during the first refresh operation, activate the fourth target control signal RDECN on the first and second refresh operations, and activate the second target control signal RDECM and the sixth target control signal LASTEN during a third refresh operation.

The word line control signal generation unit 440 may inactivate the first word line control signal NXE during the first refresh operation, and maintain the inactivated state during the target refresh section. The word line control signal generation unit 440 may latch the second word line control signal RAX<0:3> during the first refresh operation, and maintain the latched second word line control signal RAX_LAT<0:3> during the target refresh section. The transference unit 832 may transfer the latched second word line control signal RAX_LAT<0:3>, without any changes, as the transfer signal RAX_TS<0:3> in response to the fourth target control signal RDECN during the first and second refresh operations. Since the transfer signal RAX_TS<0:3> is transferred as the third word line control signal BAX<0:3> during the first and second refresh operations, the generation unit 833 may activate the third word line control signal BAX<0> during the first and second refresh operations, and may activate the third word line control signal corresponding to a last-disposed word line in a cell block, from among the third word line control signals BAX0<0:1> and BAX<0:B> during the third refresh operation.

The first redundancy control unit 471 may activate the first redundancy word line enable signal RWEN1 during the first and second refresh operations, and may inactivate the first redundancy word line enable signal RWEN1 in response to the sixth target control signal LASTEN during the third refresh operation. The first cell block selection unit 450 may activate the first block signal BLK1_SEL in response to the first redundancy enable signal RXEN1 during the first refresh operation, and maintain the activated state during the target refresh section.

During the first and second refresh operations, since the first redundancy word line enable signal RWEN1 is activated, the first word line driver 472 may activate redundancy word lines such as the first redundancy word lines RWL1_1 and RWL1_2 of the first redundancy word line group RWG1_1, selected in response to the third word line control signals BAX0<0:1> and BAX<0:3>. During the third refresh operation, since the first redundancy word line enable signal RWEN1 is inactivated, the first word line driver 472 may activate a word line such as the first word lines WL1_1 of the first word line group WG1_N, selected in response to the third word line control signals BAX0<0:1> and BAX<0:B>.

Fourth Target Refresh Example

A fourth example describes processing when a word line selected based on the first input address ADD1<0:A> is a redundancy word line, such as the first redundancy word lines RWL1_1 or RWL1_2 of the first redundancy word line group RWG1_2).

The hit signal generation unit 420 may activate the second hit signal HIT2 and the first block hit signal BLK1_HIT during a first refresh operation. The target refresh control unit 430 may inactivate the first target control signal RDECN_LAT on an entry into a target refresh section, and may activate the first target control signal RDECN_LAT in the form of a pulse during the first refresh operation. When a word line selected based on the first input address ADD1<0:A> is a first-disposed redundancy word line RWL1_1 in a redundancy word line group, the target refresh control unit 430 may activate the fourth target control signal RDECN on the first and second refresh operations, and activate the second target control signal RDECM during a third refresh operation. When a word line selected based on the first input address ADD1<0:A> is a last-disposed redundancy word line RWL1_2 in a redundancy word line group, the target refresh control unit 430 may activate the fourth target control signal RDECN on the first and third refresh operations, and activate the third target control signal RDECP during the second refresh operation.

The word line control signal generation unit 440 may inactivate the first word line control signal NXE during the first refresh operation, and maintain the inactivated state during the target refresh section. The word line control signal generation unit 440 may latch the second word line control signal RAX<0:3> during the first refresh operation, and maintain the latched second word line control signal RAX_LAT<0:3> during the target refresh section.

When a word line selected based on the first input address ADD1<0:A> is the first redundancy word line RWL1_1, the transference unit 832 may transfer the latched second word line control signal RAX_LAT<0, 1, 2, 3> as the transfer signal RAX_TS<0, 1, 2, 3> during the first and second refresh operations, and may transfer the latched second word line control signal RAX_LAT<1, 2, 3, 0> as the transfer signal RAX_TS<0, 1, 2, 3> during the third refresh operation. The generation unit 833 may output the transfer signal RAX_TS<0, 1, 2, 3> as the third word line control signal BAX<0, 1, 2, 3>. Accordingly, the third word line control signal BAX<1> may be activated during the first and second refresh operations, and the third word line control signal BAX<0> may be activated during the third refresh operation.

When it is presumed that the lowest bit ADD<0> in the address of a first-disposed word line within a word line group is "0", and the lowest bit ADD<0> in the address of a last-disposed word line within the word line group is "1", the lowest bit ADD1<0> of the first input address has a value opposite to that of the lowest bits ADD2<0> and ADD3<0> of the second and third input addresses. During the first to third refresh operations, LAX0<0>, LAX0<1>, and LAX0<1> may be activated sequentially, and BAX0<0>, BAX0<1>, and BAX0<1> may be activated sequentially.

When a word line selected based on the first input address ADD1<0:A> is the first redundancy word line RWL1_2, the transference unit 832 may transfer the latched second word line control signal RAX_LAT<0, 1, 2, 3> as the transfer signal RAX_TS<0, 1, 2, 3> during the first and third refresh operations, and may transfer the latched second word line control signal RAX_LAT<3, 0, 1, 2> as the transfer signal RAX_TS<0, 1, 2, 3> during the second refresh operation. The generation unit 833 may transfer the transfer signal RAX_TS<0, 1, 2, 3> as third word line control signal BAX<0, 1, 2, 3>. Accordingly, the third word line control signal BAX<1> may be activated during the first and third refresh operations, and the third word line control signal BAX<2> may be activated during the second refresh operation.

During the first to third refresh operations, LAX0<1>, LAX0<0>, and LAX0<0> may be activated sequentially, and BAX0<1>, BAX0<0>, and BAX0<0> may be activated sequentially.

The first redundancy control unit 471 may activate the first redundancy word line enable signal RWEN1 during the first to third refresh operations. The first cell block selection unit 450 may activate the first block signal BLK1_SEL in response to the first redundancy enable signal RXEN1 during the first refresh operation, and maintain the activated state during the target refresh section.

Since the first redundancy word line enable signal RWEN1 is activated in a refresh operation section, the first word line driver 472 may activate a redundancy word line selected in response to the third word line control signals BAX0<0:1> and BAX<0:3>. When the selected word line is the first-disposed redundancy word line RWL1_1 the first word line driver 472 may sequentially activate RWL1_1 of RWG1_2, RWL1_2 of RWG1_2, and RWL1_2 of RWG1_1 in response to the third word line control signals BAX0<0:1> and BAX<0:3>. When the selected word line is the last-disposed redundancy word line RWL1_2, the first word line driver 472 may sequentially activate RWL1_2 of RWG1_2, RWL1_1 of RWG1_3, and RWL1_1 of RWG1_2 in response to the third word line control signals BAX0<0:1> and BAX<0:3>.

Figure 10:
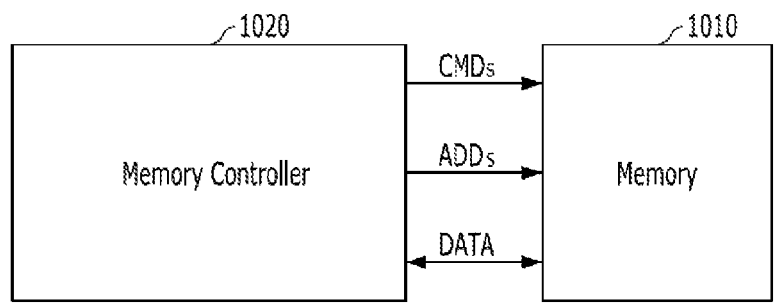
FIG. 10 is a block diagram illustrating a memory system according to an exemplary embodiment of the present invention.

FIG. 10 is a block diagram illustrating a memory system according to an exemplary embodiment of the present invention.

As illustrated in FIG. 10, the memory system may include a memory 1010 and a memory controller 1020.

The memory controller 1020 controls an operation of the memory 1010 by applying commands CMDs and addresses ADDs thereto, and transmits and receives data DATA to and from the memory 1010 during read and write operations. The memory controller 1020 may transmit the command signals CMDs to the memory 1010 so that the memory 1010 may generate a mode setup command MODE_SET, an active command ACT, and a precharge command PRE based on the command signals CMDs. When the mode setup command MODE_SET is generated based on the command signals CMDs, the memory controller 1020 may transmit the addresses ADDs for setting up an operating mode of the memory 1010, together with the command signals CMDs. When the active is command ACT is generated based on the command signals CMDs, the memory controller 1020 may transmit the addresses ADDs for selecting a cell block and word lines to be activated in the memory 1010.

The memory 1010 may detect an address of a frequently activated word line. The memory 1010 may detect and transmit the address of the frequently activated word line to the memory controller 1020, and the memory controller 1020 may control a target refresh operation to be performed in response to the address of the frequently activated word line.

When the frequently activated word line is defined as a word line which has the activation number equal to or greater than a reference number, the memory 1010 may count the activation number of a plurality of word lines and one or more redundancy word lines which are included in a cell block, detect a word line having the activation number equal to or greater than the reference number, and output an address of the detected word line as the address of the frequently activated word line.

When the frequently activated word line is defined as a word line which has an activation frequency equal to or greater than a reference frequency, the memory 1010 may store an activation history, detect a word line which is activated X times or more wherein "X" is a natural number, every Y number of active operations wherein "Y" is a natural number which is equal to or greater than "X", and output an address of the detected word line as the address of the frequently activated word line. For example, during a predetermined section, when a word line which is activated two or more times every five active operations may be detected, the address of the detected word line may be outputted as the address of the frequently activated word line. The memory 1010 may detect, as the frequently activated word line, a word line which satisfies one or more conditions of: a condition that the activation number is equal to or greater than a reference number, and an activation frequency is equal to or greater than a reference frequency.

The memory controller 1020 detects the address of a frequently activated word line in a manner similar to that described above. When the memory controller 1020 has detected the address of the frequently activated word line, the memory controller 1020 may control the memory 1010 to perform a target refresh operation, even without outputting the detected address.

The memory 1010 may be implemented with one of the memories illustrated in FIGS. 3 to 9. When the command signals CMDs and the addresses ADDs are inputted, the memory 1010 may set up an operating mode according to the addresses ADDs when the mode setup command MODE_SET is inputted, perform an active operation when the active command ACT is inputted, and perform a precharge operation when the precharge command PRE is inputted. In this example, methods in which the memory 1010 performs the mode setup operating, the active, or precharge operation, and the target refresh operation are the same as those described with reference to FIG. 3 to FIG. 10. When receiving read and write commands from the memory controller 1020, the memory 1010 transmits and receives data DATA to and from the memory controller 1020.

For reference, the sequence of adjacent word lines to be activated during a target refresh operation, and the number of adjacent word lines to be refreshed during a target refresh section may vary depending on design. For example, when a $K^{th}$ word line is a frequently activated word line, a $(K-1)$ word line may be refreshed during a second refresh operation and a $(K+1)^{th}$ word line may be refreshed during a third refresh operation in a target refresh section. The frequently activated word line is not necessarily required to be refreshed in a target refresh section. In addition, the number of word lines refreshed in a target refresh section may be less than three when only one of first and second adjacent word lines is refreshed, or may be greater than three when the number of adjacent word lines is greater than two, and the adjacent word lines are refreshed during a refresh section.

The present technology performs a target refresh operation on adjacent word lines which are adjacent to a frequently activated word line, and thus data of a memory cell coupled to the adjacent word lines may be prevented from being lost. Even when a frequently activated word line is a redundancy word line replaced for a normal word line, the present technology may prevent data of a memory cell coupled to the adjacent word lines from being lost.

Although various embodiments have been described for illustrative purposes, it will be apparent to those skilled in the art that various changes and modifications may be made without departing from the spirit and scope of the invention as defined in the following claims.

What is claimed is:

1. A memory comprising:
    a first cell block comprising a plurality of first word line groups each having two or more first word lines, and one or more first redundancy word line groups each having two or more first redundancy word lines and corresponding to one hit signal of a plurality of hit signals;
    a second cell block comprising a plurality of second word line groups each having two or more second word lines, and one or more second redundancy word line groups each having two or more second redundancy word lines and corresponding to one hit signal of the plurality of hit signals; and
    a control unit suitable for selecting a cell block and a word line in response to a first input address and refreshing a selected word line based on an input address inputted after the first input address, while refreshing one or more adjacent word lines adjacent to a first selected word line, which is selected by the first input address, in response to the first input address and the hit signals when the first selected word line is adjacent to a redundancy word line, wherein the first input address is first inputted in a target refresh section,
    wherein, in the first cell block, the first word lines are sequentially disposed, and the first redundancy word lines are sequentially disposed after a last-disposed first word line; and in the second cell block, the second word lines are sequentially disposed, and the second redundancy word lines are sequentially disposed after a last-disposed second word line.

2. The memory of claim 1, wherein, when a word line corresponding to the first input address is not replaced by a redundancy word line, the first selected word line is a normal word line corresponding to the first input address; and when a word line corresponding to the first input address is replaced by a redundancy word line, the first selected word line is the redundancy word line replaced for the normal word line corresponding to the first input address.

3. The memory of claim 1, wherein the first input address, a second input address, and a third input address are inputted sequentially in the target refresh section, and the second input address and the third input address are addresses of adjacent word lines.

4. The memory of claim 3, wherein, when the first selected word line is a last-disposed word line, the adjacent word lines comprise a word line disposed before the last-disposed word line, and a first-disposed redundancy word line.

5. The memory of claim 3, wherein, when the first selected word line is a first-disposed redundancy word line, the adjacent word lines comprise a last-disposed word line, and a redundancy word line disposed after the first-disposed redundancy word line.

6. The memory of claim 3, wherein, when the first selected word line is one of redundancy word lines, except for a first-disposed redundancy word line, the adjacent word lines comprise a redundancy word line disposed before the first selected word line, and a redundancy word line disposed after the first selected word line.

7. The memory of claim 1, wherein the control unit is suitable for performing a refresh operation three times during the target refresh section, wherein the control unit is suitable for refreshing the first selected word line, a first adjacent word line disposed after the first selected word line, and a second adjacent word line disposed before the first selected word line.

8. The memory of claim 3, wherein the control unit comprises a cell block selection unit suitable for selecting one of the first and second cell blocks in response to the input address while selecting one of the first and second cell blocks in response to the first input address during the target refresh section.

9. The memory of claim 8, wherein the control unit comprises a hit signal generation unit suitable for generating the plurality of hit signals corresponding to the first redundancy word line groups and the second redundancy word line groups, a first block hit signal corresponding to the first cell block, and a second block hit signal corresponding to the second cell block, wherein the hit signal generation unit activates a hit signal corresponding to a redundancy word line group to be replaced with a word line group corresponding to an input address, activates the first block hit signal when the activated hit signal corresponds to the first redundancy word line group, and activates the second block hit signal when the activated hit signal corresponds to the second redundancy word line group.

10. The memory of claim 9, wherein the control unit comprises a target refresh control unit suitable for generating a plurality of control signals for controlling a target refresh operation in response to an entry signal activated on entry into the target refresh section, a termination signal activated on termination of the target refresh section, a section signal activated during the target refresh section, an active signal activated in response to an active command, and the input address and signals corresponding to first-disposed first and second redundancy word lines.

11. The memory of claim 10, wherein the plurality of control signals comprises a first target control signal used to latch the first input address, a second target control signal activated when the first selected word line is a first-disposed redundancy word line in a redundancy word line group, a third target control signal activated when the first selected word line is a last-disposed redundancy word line in a redundancy word line group, a fourth target control signal activated in a section in which the second target control signal and the third target control signal are inactivated, a fifth target control signal activated when the first selected word line is a last-disposed word line in a cell block, and a sixth target control signal activated when the first selected word line is a first-disposed redundancy word line in a cell block.

12. The memory of claim 11, wherein the control unit comprises a word line control signal generation unit suitable for generating a plurality of word line control signals for controlling word lines and redundancy word lines, in response to the plurality of hit signals, the first and second block hit signals, a plurality of decoded signals obtained by decoding the input address, and the first to sixth target control signals.

13. The memory of claim 10, wherein the plurality of word line control signals comprise a first word line control signal activated when a word line corresponding to the first input address is not replaced by a redundancy word line, one or more second word line control signals corresponding to the first and second redundancy word line groups, and a plurality of third word line control signals generated based on the plurality of decoded signals and the second word line control signals.

14. The memory of claim 13, wherein the word line control signal generation unit comprises:
a first word line control signal generation unit suitable for latching the first block hit signal or the second block hit signal when the first target control signal is activated, and inactivating the first word line control signal when the latched block hit signal or the fifth target control signal is activated;
a second word line control signal generation unit suitable for generating the second word line control signals in response to the plurality of hit signals; and
a third word line control signal generation unit suitable for latching the second word line control signals when the first target control signal is activated, and transferring the plurality of decoded signals and the second word line control signals as the plurality of third word line control signals in response to a relation set in response to the first word line control signal and the second to fourth target control signals.

15. The memory of claim 13, wherein the control unit comprises:
a first word line control unit suitable for selecting one of the first word lines in response to the plurality of third word line control signals when the first cell block is selected and when either the sixth target control signal is activated or the sixth target control signal is inactivated and the first word line control signal is activated, and selecting one of the first redundancy word lines in response to the plurality of third word line control signals when the sixth target control signal and the first word line control signal are inactivated; and
a second word line control unit suitable for selecting one of the second word lines in response to the plurality of third word line control signals when the second cell block is selected and when either the sixth target control signal is activated or the sixth target control signal is inactivated and the first word line control signal is activated, and selecting one of the second redundancy word lines in response to the plurality of third word line control signals when the sixth target control signal and the first word line control signal are inactivated.

16. A memory system comprising:
a memory comprising a first cell block suitable for including a plurality of first word line groups each having two or more first word lines, and one or more first redundancy word line groups each having two or more first redundancy word lines and corresponding to one hit signal of a plurality of hit signals, and a second cell block suitable for including a plurality of second word line groups each having two or more second word lines, and one or more second redundancy word line groups each having two or more second redundancy word lines and corresponding to one hit signal of the plurality of hit signals, wherein the memory selects a cell block and a word line in response to a first input address and refreshes a selected word line based on an input address inputted after the first input address, while refreshing one or more adjacent word lines adjacent to the first selected word line, which is selected by the first input word line, in response to the first input address and the hit signals when the first selected word line is adjacent to a redundancy word line, wherein the first is first inputted in a target refresh section; and
a memory controller suitable for controlling the memory to enter the target refresh section when a word line on which the target refresh operation is to be performed is detected, and applying one or more addresses for selecting the detected word line to the memory during the target refresh operation.

17. The memory system of claim 16, wherein, when a word line corresponding to the first input address is not replaced by a redundancy word line, the first selected word line is a normal word line corresponding to the first input address; and when a word line corresponding to the first input address is replaced by a redundancy word line, the first selected word line is the redundancy word line replaced for the normal word line corresponding to the first input address.

18. The memory system of claim 16, wherein, in the first cell block, the first word lines are sequentially disposed, and the first redundancy word lines are disposed sequentially after a last-disposed first word line; and in the second cell block, the second word lines are sequentially disposed, and the second redundancy word lines are sequentially disposed after a last-disposed second word line.

19. The memory system of claim 16, wherein the first input address, a second input address, and a third input address are inputted sequentially in the target refresh section, and the second input address and the third input address are addresses of the adjacent word lines.

20. The memory system of claim 19, wherein when the first selected word line is a last-disposed word line, the adjacent word lines comprise a word line disposed before the last-disposed word line, and a first-disposed redundancy word line.

21. The memory of claim 19, wherein when the first selected word line is a first-disposed redundancy word line, the adjacent word lines comprise a last-disposed word line, and a redundancy word line disposed after the first-disposed redundancy word line.

22. The memory system of claim 19, wherein when the first selected word line is one of redundancy word lines, except for a first-disposed redundancy word line, the adjacent word lines comprise a redundancy word line disposed before the first selected word line, and a redundancy word line disposed after the first selected word line.

23. The memory system of claim 16, wherein the memory is suitable for performing a refresh operation three times during the target refresh section, wherein the memory is suitable for refreshing the first selected word line, a first adjacent word line disposed after the first selected word line selected, and a second adjacent word line disposed before the first selected word line.

* * * * *